United States Patent
Seki et al.

(10) Patent No.: US 9,457,447 B2
(45) Date of Patent: Oct. 4, 2016

(54) POLISHING APPARATUS AND POLISHING METHOD

(75) Inventors: Masaya Seki, Tokyo (JP); Tetsuji Togawa, Tokyo (JP); Masayuki Nakanishi, Tokyo (JP)

(73) Assignee: EBARA CORPORATION, Tokyo (JP)

(*) Notice: Subject to any disclaimer, the term of this patent is extended or adjusted under 35 U.S.C. 154(b) by 151 days.

(21) Appl. No.: 13/073,218

(22) Filed: Mar. 28, 2011

(65) Prior Publication Data
US 2012/0252320 A1    Oct. 4, 2012

(51) Int. Cl.
| | |
|---|---|
| *B24B 1/00* | (2006.01) |
| *B24B 21/00* | (2006.01) |
| *B24B 9/06* | (2006.01) |
| *B24B 21/20* | (2006.01) |
| *H01L 21/306* | (2006.01) |
| *H01L 21/67* | (2006.01) |
| *H01L 21/68* | (2006.01) |
| *H01L 21/84* | (2006.01) |
| *H01L 21/66* | (2006.01) |

(52) U.S. Cl.
CPC ............ *B24B 21/002* (2013.01); *B24B 9/065* (2013.01); *B24B 21/20* (2013.01); *H01L 21/30625* (2013.01); *H01L 21/67092* (2013.01); *H01L 21/67259* (2013.01); *H01L 21/68* (2013.01); *H01L 21/84* (2013.01); *H01L 22/20* (2013.01)

(58) Field of Classification Search
CPC ..... B24B 9/065; B24B 21/002; B24B 21/00; B24B 37/042; B24B 21/20; H01L 21/30625; H01L 21/67092; H01L 21/67259; H01L 21/68; H01L 21/84; H01L 22/20

USPC .................. 451/9, 36, 37, 303, 456
See application file for complete search history.

(56) References Cited

U.S. PATENT DOCUMENTS

| | | | | |
|---|---|---|---|---|
| 3,170,272 A | * | 2/1965 | Burnham | 451/59 |
| 4,231,193 A | * | 11/1980 | Siegel | 451/303 |
| 4,719,721 A | * | 1/1988 | Stump | 451/300 |
| 5,509,850 A | * | 4/1996 | Morioka et al. | 451/168 |
| 5,593,344 A | * | 1/1997 | Weldon et al. | 451/296 |
| 5,643,044 A | * | 7/1997 | Lund | 451/5 |

(Continued)

FOREIGN PATENT DOCUMENTS

| | | |
|---|---|---|
| CN | 1287040 | 3/2001 |
| JP | 4-85827 | 3/1992 |

(Continued)

*Primary Examiner* — Joseph J Hail
*Assistant Examiner* — Marc Carlson
(74) *Attorney, Agent, or Firm* — Wenderoth, Lind & Ponack, L.L.P.

(57) ABSTRACT

The polishing apparatus has a polishing unit capable of forming a right-angled cross section by polishing a peripheral portion of the substrate. The polishing unit includes a polishing head having a pressing member configured to press a polishing tape against the peripheral portion of the substrate from above, a tape supply and recovery mechanism configured to supply the polishing tape to the polishing head and to recover the polishing tape from the polishing head, a first moving mechanism configured to move the polishing head in a radial direction of the substrate, and a second moving mechanism configured to move the tape supply and recovery mechanism in the radial direction of the substrate. The guide rollers are arranged such that the polishing tape extends parallel to a tangential direction of the substrate and a polishing surface of the polishing tape is parallel to a surface of the substrate.

18 Claims, 31 Drawing Sheets

(56) References Cited

U.S. PATENT DOCUMENTS

| | | | |
|---|---|---|---|
| 6,110,025 A * | 8/2000 | Williams et al. | 451/286 |
| 6,402,596 B1 * | 6/2002 | Hakomori et al. | 451/44 |
| 6,458,021 B1 * | 10/2002 | Takeyama et al. | 451/302 |
| 6,629,875 B2 * | 10/2003 | Steere, III | 451/9 |
| 6,951,511 B2 * | 10/2005 | Gurusamy et al. | 451/168 |
| 7,077,733 B1 * | 7/2006 | Taylor | 451/303 |
| 7,108,582 B2 * | 9/2006 | Sato et al. | 451/11 |
| 7,621,799 B2 * | 11/2009 | Sakairi | 451/36 |
| 7,744,445 B2 * | 6/2010 | Kubota et al. | 451/41 |
| 2002/0182985 A1 * | 12/2002 | Shiino et al. | 451/44 |
| 2004/0082278 A1 * | 4/2004 | Enomoto et al. | 451/41 |
| 2006/0094343 A1 * | 5/2006 | Sato et al. | 451/313 |
| 2008/0293331 A1 * | 11/2008 | Chen et al. | 451/37 |
| 2008/0293333 A1 * | 11/2008 | Zhang et al. | 451/41 |
| 2008/0293336 A1 | 11/2008 | Zhang et al. | |
| 2009/0029629 A1 * | 1/2009 | Shin et al. | 451/5 |
| 2009/0124174 A1 * | 5/2009 | Fukushima et al. | 451/44 |
| 2009/0142992 A1 * | 6/2009 | Takahashi et al. | 451/9 |
| 2009/0227189 A1 * | 9/2009 | Maeda et al. | 451/303 |
| 2010/0178851 A1 * | 7/2010 | Nakanishi et al. | 451/44 |
| 2011/0207294 A1 * | 8/2011 | Nakanishi et al. | 438/459 |
| 2011/0237164 A1 * | 9/2011 | Seki et al. | 451/44 |
| 2011/0256811 A1 * | 10/2011 | Nakanishi et al. | 451/41 |
| 2012/0135668 A1 * | 5/2012 | Nakanishi et al. | 451/28 |
| 2012/0208437 A1 * | 8/2012 | Takahashi et al. | 451/8 |
| 2012/0244787 A1 * | 9/2012 | Seki et al. | 451/303 |

FOREIGN PATENT DOCUMENTS

| | | |
|---|---|---|
| JP | 8-1494 | 1/1996 |
| JP | 8-97111 | 4/1996 |
| JP | 2002-126981 | 5/2002 |
| JP | 2009-154285 | 7/2009 |

* cited by examiner

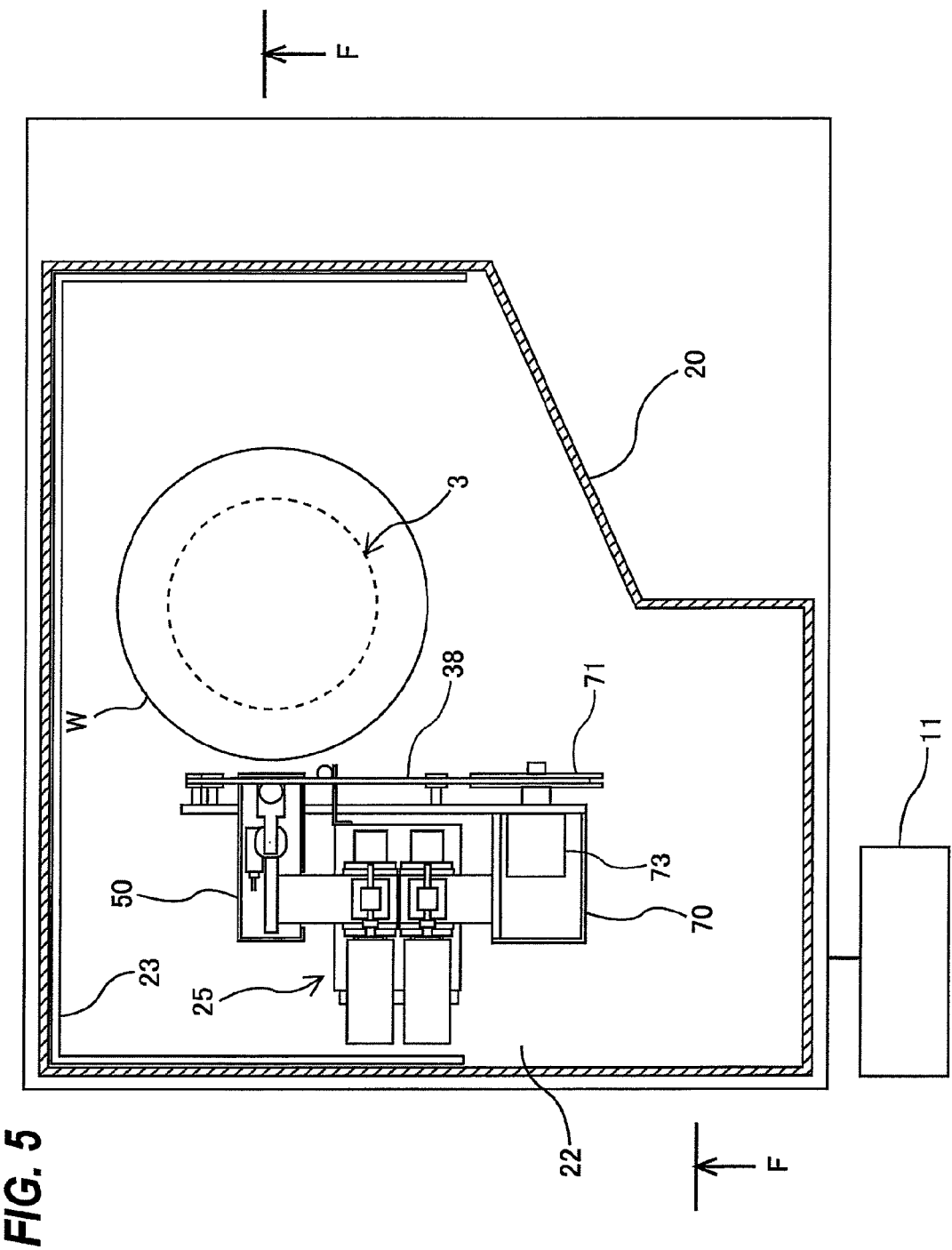

RETREAT POSITION

TAPE EDGE DETECTING POSITION

POLISHING POSITION

POLISHING APPARATUS AND POLISHING METHOD

BACKGROUND OF THE INVENTION

1. Field of the Invention

The present invention relates to a polishing apparatus and a polishing method for polishing a peripheral portion of a substrate, such as a semiconductor wafer, and more particularly to a polishing apparatus and a polishing method for polishing a peripheral portion of a substrate by pressing a polishing tape against the peripheral portion of the substrate.

2. Description of the Related Art

From a viewpoint of improving yield in fabrication of semiconductor devices, management of surface conditions of a peripheral portion of a substrate has been attracting attention in recent years. In the fabrication process of the semiconductor devices, various materials are deposited on a silicon wafer to form a multilayer structure. As a result, unwanted films and roughened surface are formed on a peripheral portion of the substrate. It has been a recent trend to transport the substrate by holding only its peripheral portion using arms. Under such circumstances, the unwanted films remaining on the peripheral portion would be peeled off during various processes and could adhere to devices, causing lowered yield. Thus, in order to remove the unwanted films, the peripheral portion of the substrate is polished using a polishing apparatus.

This type of polishing apparatus polishes the peripheral portion of the substrate by bringing a polishing surface of a polishing tape into contact with the peripheral portion of the substrate. In this specification, the peripheral portion is defined as a region including a bevel portion which is the outermost portion of the substrate and a top edge portion and bottom edge portion located radially inwardly of the bevel portion.

FIG. 1A and FIG. 1B are enlarged cross-sectional views each showing a peripheral portion of a substrate. More specifically, FIG. 1A shows a cross-sectional view of a so-called straight-type substrate, and FIG. 1B shows a cross-sectional view of a so-called round-type substrate. In the substrate W shown in FIG. 1A, the bevel portion is an outermost circumferential surface of the substrate W (indicated by a symbol B) that is constituted by an upper slope (an upper bevel portion) P, a lower slope (a lower bevel portion) Q, and a side portion (an apex) R. In the substrate W shown in FIG. 1B, the bevel portion is a portion B having a curved cross section and forming an outermost circumferential surface of the substrate W. The top edge portion is a flat portion E1 located radially inwardly of the bevel portion B and located radially outwardly of a region D where devices are formed. The bottom edge portion is a flat portion E2 located opposite the top edge portion and located radially inwardly of the bevel portion B. These top edge portion E1 and bottom edge portion E2 may be collectively referred to as near-edge portions.

In the conventional polishing apparatus, the polishing tape is pressed by a polishing head against the peripheral portion of the substrate to thereby polish the peripheral portion (see Japanese laid-open patent publication No. 2002-126981, for example). As shown in FIG. 2, when polishing the top edge portion of the substrate, a polishing tape 301 is pressed by a polishing head 300, with the polishing head 300 and the polishing tape 301 inclined.

However, polishing of the peripheral portion of the substrate with the inclined polishing tape results in an oblique edge surface of a device layer, as shown in FIG. 3. The device layer having such an oblique edge surface could raise the following problem in fabrication processes of SOI (Silicon on Insulator) substrate. The SOI substrate is fabricated by sticking a device substrate and a silicon substrate together. More specifically, as shown in FIG. 4A and FIG. 4B, the device substrate W1 and the silicon substrate W2 are stuck together, and then as shown in FIG. 4C, the device substrate W1 is ground from behind by a grinder, whereby the SOI substrate as shown in FIG. 4D is obtained.

Since the device layer has the oblique edge surface, an acute edge is formed as shown in FIG. 4D. Such an acute edge is easily broken, and fragments thereof may be attached as particles to a surface of the device layer. These particles on the device layer would cause defects in devices, thus lowering yield.

The Japanese laid-open patent publication No. 8-97111 discloses a polishing apparatus having a right-angled member that presses a polishing tape against a peripheral portion of a substrate. However, since the polishing tape has a certain thickness and a certain hardness, the polishing tape is not bent at right angles along the right-angled member in a microscopic level, and the polishing tape is rounded to some degree. As a result, the oblique edge surface is formed on the device layer.

SUMMARY OF THE INVENTION

The present invention has been made in view of the above drawback. It is therefore an object of the present invention to provide a polishing apparatus and a polishing method capable of polishing a peripheral portion of a substrate to form a right-angled cross section in the peripheral portion.

One aspect of the present invention for achieving the above object is a polishing apparatus including: a substrate holder configured to hold a substrate and to rotate the substrate; and at least one polishing unit configured to polish a peripheral portion of the substrate. The polishing unit includes a polishing head having a pressing member configured to press a polishing tape against the peripheral portion of the substrate from above, a tape supply and recovery mechanism configured to supply the polishing tape to the polishing head and to recover the polishing tape from the polishing head, a first moving mechanism configured to move the polishing head in a radial direction of the substrate, and a second moving mechanism configured to move the tape supply and recovery mechanism in the radial direction of the substrate. The tape supply and recovery mechanism has guide rollers for supporting the polishing tape. The guide rollers are arranged such that the polishing tape extends parallel to a tangential direction of the substrate and a polishing surface of the polishing tape is parallel to a surface of the substrate.

In a preferred aspect of the present invention, the polishing apparatus further includes a polishing-unit moving mechanism configured to move the polishing unit in the tangential direction of the substrate.

In a preferred aspect of the present invention, the polishing apparatus further includes a tape-edge detection sensor configured to detect a position of an edge of the polishing tape.

In a preferred aspect of the present invention, the first moving mechanism is configured to move the pressing member to a predetermined polishing position, and the second moving mechanism is configured to move the tape supply and recovery mechanism such that the edge of the polishing tape coincides with an edge of the pressing member at the predetermined polishing position based on the position of the edge of the polishing tape detected by the tape-edge detection sensor.

In a preferred aspect of the present invention, the pressing member has a through-hole that extents in a vertical direction, and the through-hole is coupled to a vacuum line.

In a preferred aspect of the present invention, the at least one polishing unit comprises a plurality of polishing units.

In a preferred aspect of the present invention, the polishing head has a position sensor configured to detect a vertical position of the pressing member.

Another aspect of the present invention is a polishing method including: rotating a substrate; providing a polishing tape above a peripheral portion of the substrate such that a polishing surface of the polishing tape is parallel to a surface of the substrate, the polishing tape extending parallel to a tangential direction of the substrate; and pressing the polishing tape against the peripheral portion of the substrate from above by a pressing member to polish the peripheral portion.

In a preferred aspect of the present invention, the pressing of the polishing tape against the peripheral portion of the substrate is performed while oscillating the polishing tape in the tangential direction of the substrate.

In a preferred aspect of the present invention, the pressing of the polishing tape against the peripheral portion of the substrate is performed with an edge of the pressing member coinciding with an edge of the polishing tape.

In a preferred aspect of the present invention, the pressing of the polishing tape against the peripheral portion of the substrate is performed with the polishing tape secured to the pressing member by vacuum suction.

In a preferred aspect of the present invention, the polishing method further includes terminating the polishing of the peripheral portion of the substrate based on a vertical position of the pressing member.

According to the present invention, the polishing surface of the polishing tape is pressed against the peripheral portion of the substrate from above to thereby polish the top edge portion of the substrate. During polishing of the substrate, the edge of the polishing tape is pressed against the substrate. Therefore, a polished portion can have a right-angled cross-sectional shape. Further, according to the present invention, the polishing head and the polishing tape are movable independently. With these configurations, the polishing tape can be moved such that the edge of the polishing tape coincides with the edge of the pressing member of the polishing head by a distance that can vary depending on the width of the polishing tape. Therefore, the polishing head can press the polishing tape against the substrate with the edge of the pressing member coinciding with the edge of the polishing tape. As a result, a right-angled polishing profile can be formed.

BRIEF DESCRIPTION OF THE DRAWINGS

FIG. 5 is a plan view showing a polishing apparatus according to an embodiment of the present invention;

DETAILED DESCRIPTION OF THE PREFERRED EMBODIMENTS

Embodiments of the present invention will be described below with reference to the drawings.

Figure 6:
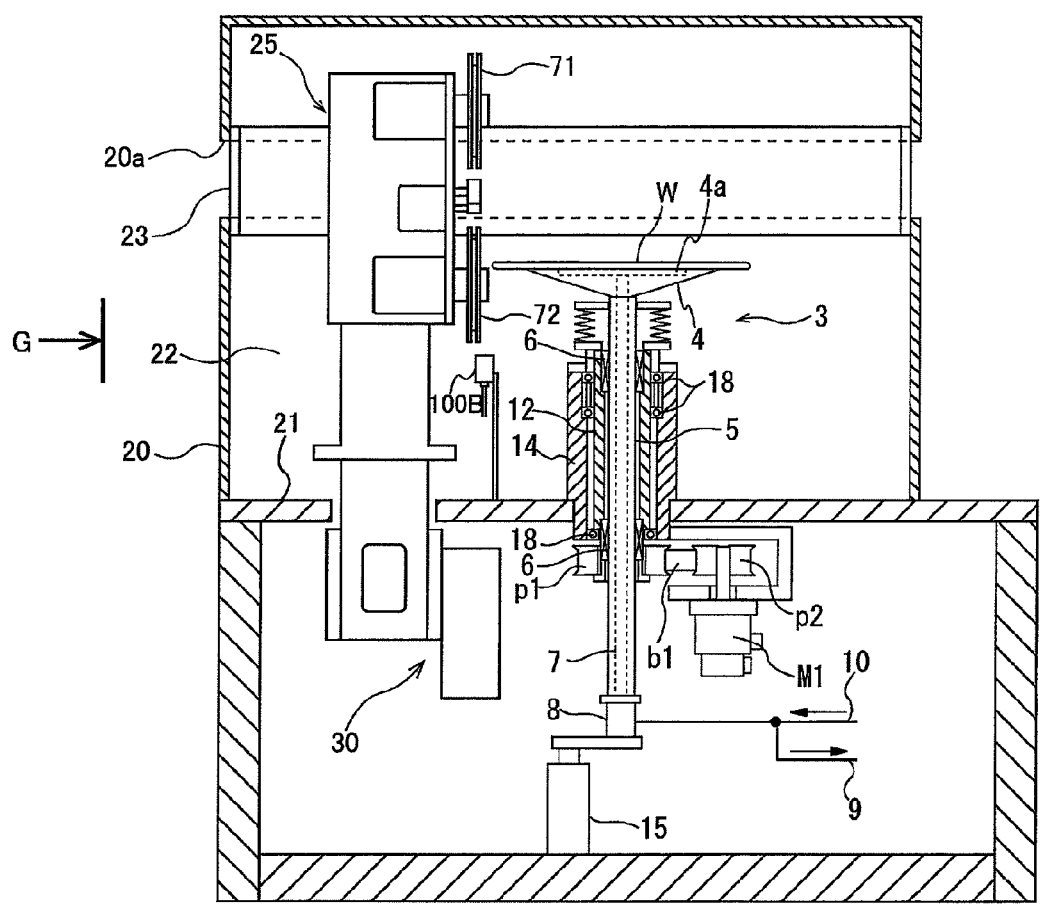
FIG. 6 is a cross-sectional view taken along line F-F in FIG. 5.
Figure 7:
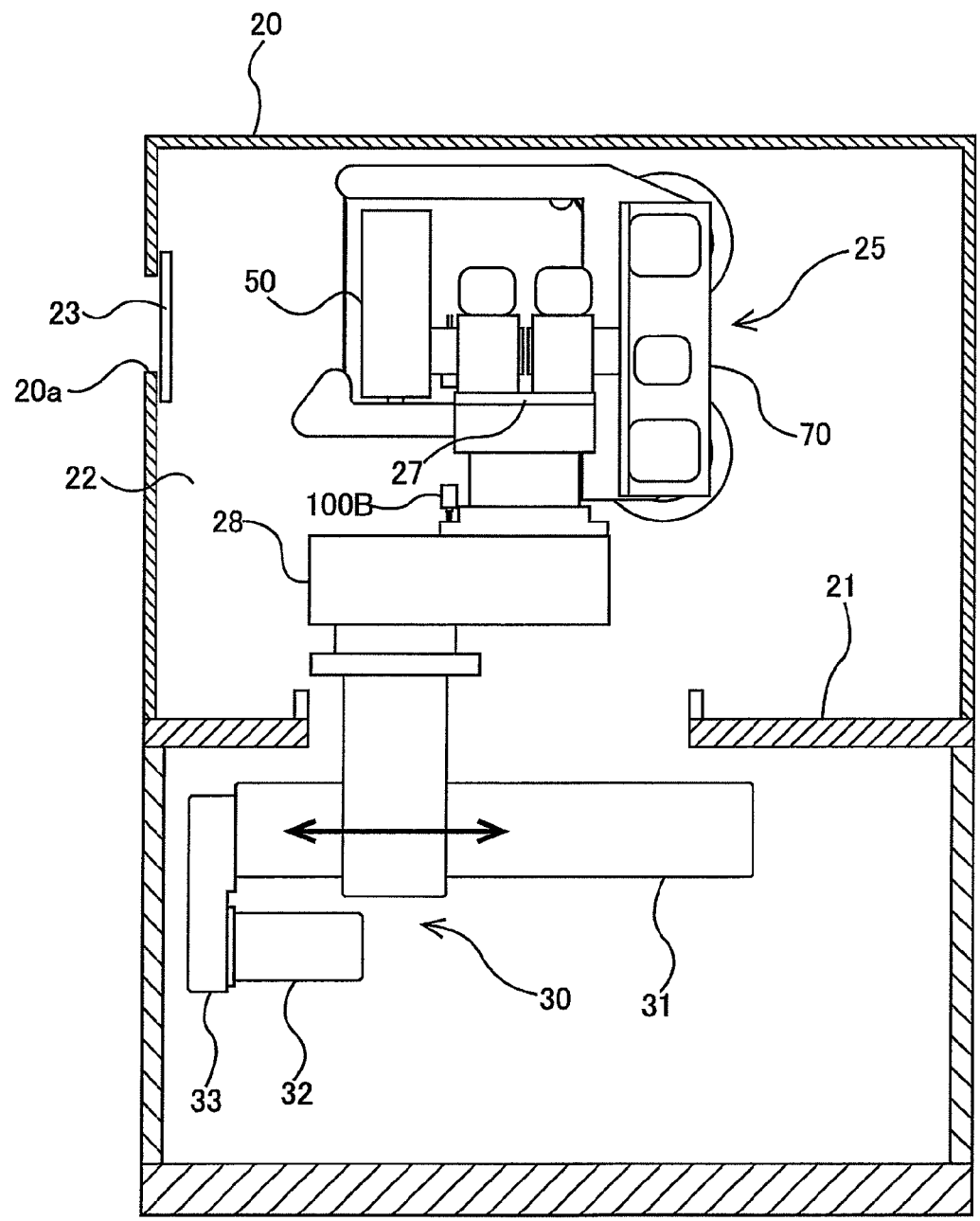
FIG. 7 is a view as viewed from a direction indicated by arrow G in FIG. 6.

FIG. 5 is a plan view showing a polishing apparatus according to an embodiment of the present invention, FIG. 6 is a cross-sectional view taken along line F-F in FIG. 5, and FIG. 7 is a view as viewed from a direction indicated by arrow G in FIG. 6.

The polishing apparatus according to the embodiment includes a substrate holder 3 configured to hold a substrate W (i.e., a workpiece to be polished) horizontally and to rotate the substrate W. FIG. 5 shows a state in which the substrate holder 3 holds the substrate W. This substrate holder 3 has a holding stage 4 configured to hold a lower surface of the substrate W by a vacuum suction, a hollow shaft 5 coupled to a central portion of the holding stage 4, and a motor M1 for rotating the hollow shaft 5. The substrate W is placed onto the holding stage 4 such that a center of the substrate W is aligned with a central axis of the hollow shaft 5. The holding stage 4 is located in a polishing chamber 22 that is defined by a partition 20 and a base plate 21.

The hollow shaft 5 is supported by ball spline bearings (i.e., linear motion bearings) 6 which allow the hollow shaft 5 to move vertically. The holding stage 4 has an upper surface with grooves 4a. These grooves 4a communicate with a communication passage 7 extending through the hollow shaft 5. The communication passage 7 is coupled to a vacuum line 9 via a rotary joint 8 provided on a lower end of the hollow shaft 5. The communication passage 7 is also coupled to a nitrogen-gas supply line 10 for use in releasing the substrate W from the holding stage 4 after processing. By selectively coupling the vacuum line 9 and the nitrogen-gas supply line 10 to the communication passage 7, the substrate W can be held on the upper surface of the holding stage 4 by the vacuum suction and can be released from the upper surface of the holding stage 4.

A pulley p1 is coupled to the hollow shaft 5, and a pulley p2 is mounted on a rotational shaft of the motor M1. The hollow shaft 5 is rotated by the motor M1 through the pulley p1, the pulley p2, and a belt b1 riding on these pulleys p1 and p2. The ball spline bearing 6 is a bearing that allows the hollow shaft 5 to move freely in its longitudinal direction. The ball spline bearings 6 are secured to a cylindrical casing 12. Therefore, the hollow shaft 5 can move linearly up and down relative to the casing 12, and the hollow shaft 5 and the casing 12 rotate in unison. The hollow shaft 5 is coupled to an air cylinder (elevating mechanism) 15, so that the hollow shaft 5 and the holding stage 4 are elevated and lowered by the air cylinder 15.

A cylindrical casing 14 is provided so as to surround the casing 12 in a coaxial arrangement. Radial bearings 18 are provided between the casing 12 and the casing 14, so that the casing 12 is rotatably supported by the radial bearings 18. With these structures, the substrate holder 3 can rotate the substrate W about its central axis and can elevate and lower the substrate W along the central axis.

A polishing unit 25 for polishing a peripheral portion of the substrate W is provided radially outwardly of the substrate W held by the substrate holder 3. This polishing unit 25 is located in the polishing chamber 22. As shown in FIG. 7, the polishing unit 25 in its entirety is secured to a mount base 27, which is coupled to a polishing-unit moving mechanism 30 via an arm block 28.

The polishing-unit moving mechanism 30 has a ball screw mechanism 31 that slidably holds the arm block 28, a motor 32 for driving the ball screw mechanism 31, and a power transmission mechanism 33 that couples the ball screw mechanism 31 and the motor 32 to each other. The power transmission mechanism 33 is constructed by pulleys, a belt, and the like. As the motor 32 operates, the ball screw mechanism 31 moves the arm block 28 in directions indicated by arrows in FIG. 7 to thereby move the polishing unit 25 in its entirety in a tangential direction of the substrate W. This polishing-unit moving mechanism 30 also serves as an oscillation mechanism for oscillating the polishing unit 25 at a predetermined amplitude and a predetermined speed.

The polishing unit 25 includes a polishing head 50 for polishing the periphery of the substrate W using a polishing tape 38, and a polishing-tape supply and recovery mechanism 70 for supplying the polishing tape 38 to the polishing head 50 and recovering the polishing tape 38 from the polishing head 50. The polishing head 50 is a top-edge polishing head for polishing the top edge portion of the substrate W by pressing a polishing surface of the polishing tape 38 against the peripheral portion of the substrate W from above.

Figure 8:
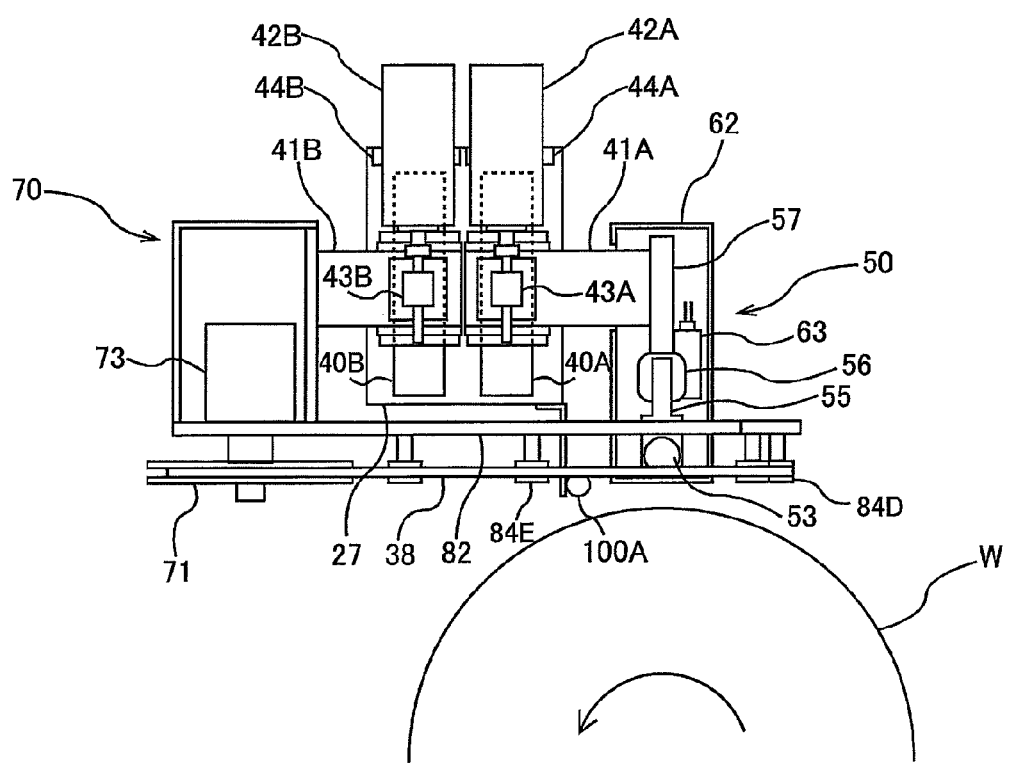
FIG. 8 is a plan view of a polishing head and a polishing-tape supply and recovery mechanism.
Figure 9:
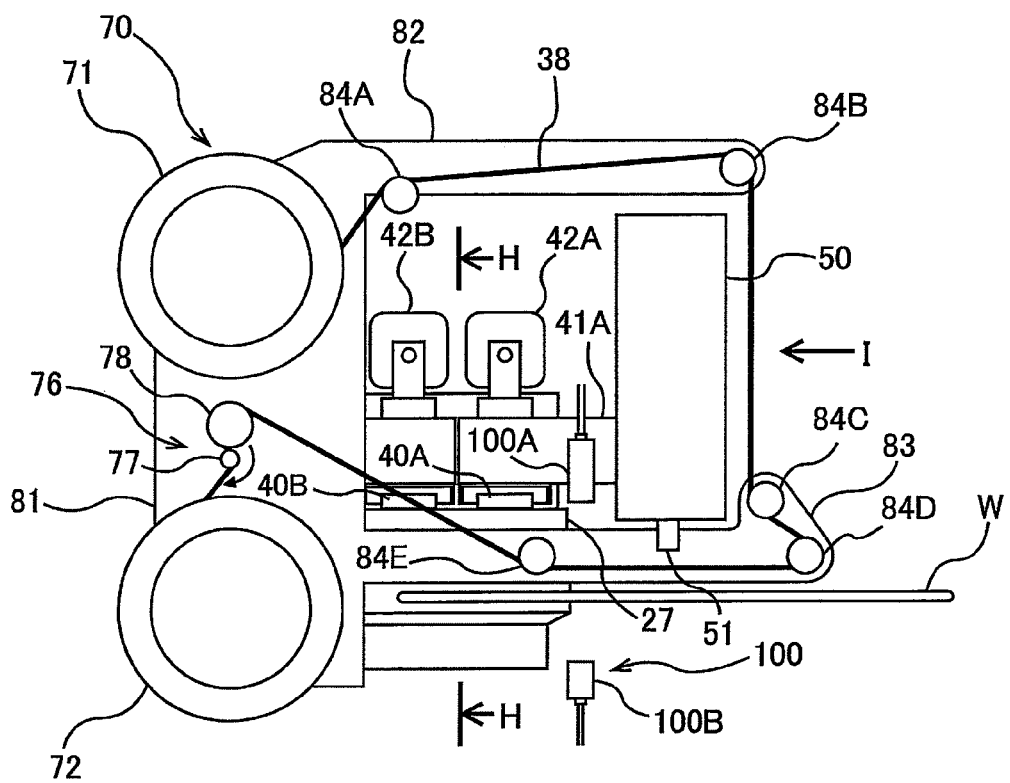
FIG. 9 is a front view of the polishing head and the polishing-tape supply and recovery mechanism.
Figure 10:
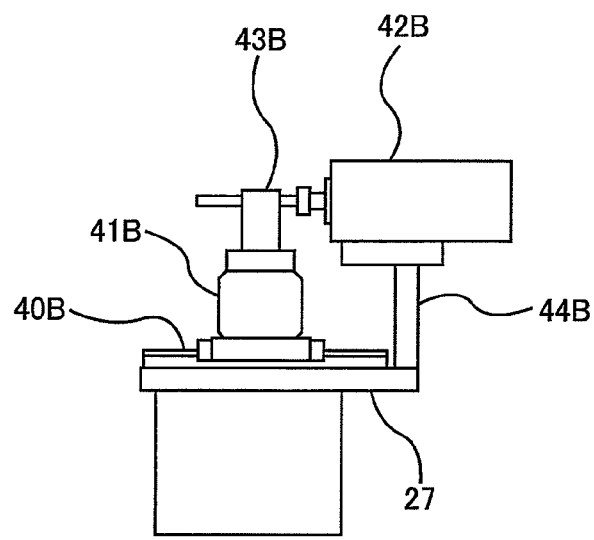
FIG. 10 is a cross-sectional view taken along line H-H in FIG. 9.
Figure 11:
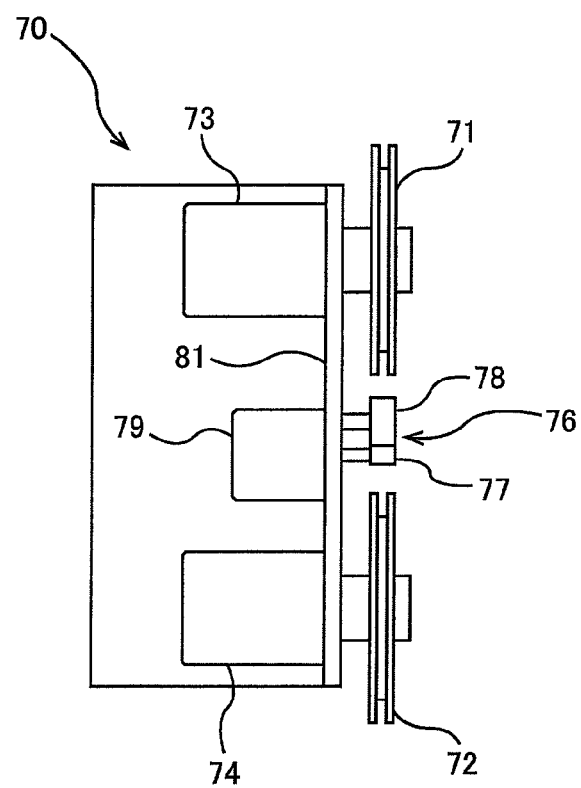
FIG. 11 is a side view of the polishing-tape supply and recovery mechanism shown in FIG. 9.
Figure 12:
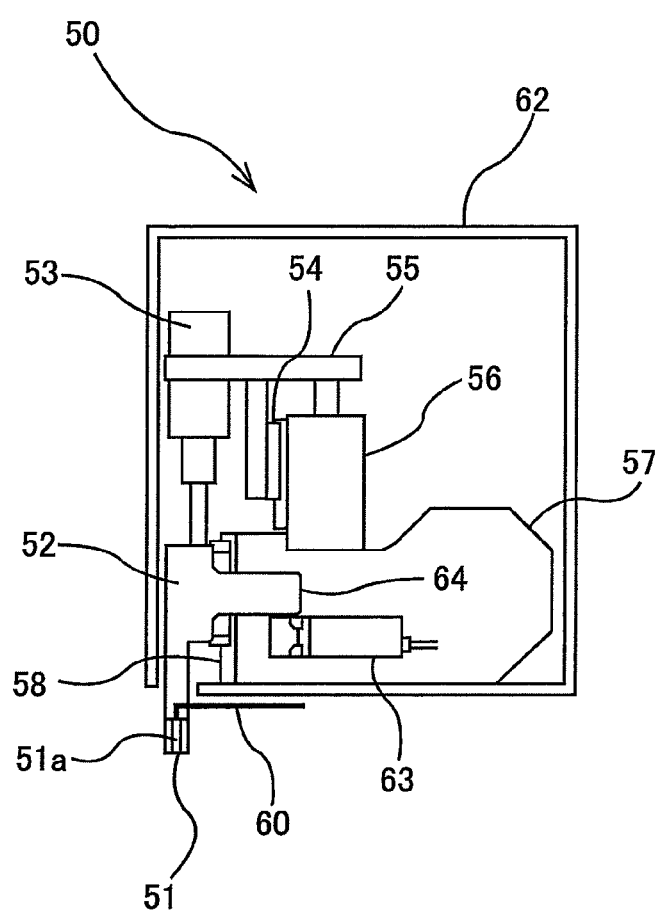
FIG. 12 is a vertical cross-sectional view of the polishing head as viewed from a direction indicated by arrow I in FIG. 9.

FIG. 8 is a plan view of the polishing head 50 and the polishing-tape supply and recovery mechanism 70, FIG. 9 is a front view of the polishing head 50 and the polishing-tape supply and recovery mechanism 70, FIG. 10 is a cross-sectional view taken along line in FIG. 9, FIG. 11 is a side view of the polishing-tape supply and recovery mechanism 70 shown in FIG. 9, and FIG. 12 is a vertical cross-sectional view of the polishing head 50 as viewed from a direction indicated by arrow I in FIG. 9.

Two linear motion guides 40A and 40B, which extend parallel to a radial direction of the substrate W, are disposed on the mount base 27. The polishing head 50 and the linear motion guide 40A are coupled to each other via a coupling block 41A. Further, the polishing head 50 is coupled to a motor 42A and a ball screw 43A for moving the polishing head 50 along the linear motion guide 40A (i.e., in the radial direction of the substrate W). More specifically, the ball screw 43A is secured to the coupling block 41A, and the motor 42A is secured to the mount base 27 through a support member 44A. The motor 42A is configured to rotate a screw shaft of the ball screw 43A, so that the coupling block 41A and the polishing head 50 (which is coupled to the coupling block 41A) are moved along the linear motion guide 40A. The motor 42A, the ball screw 43A, and the linear motion guide 40A constitute a first moving mechanism for moving the polishing head 50 in the radial direction of the substrate W held on the substrate holder 3.

Similarly, the polishing-tape supply and recovery mechanism 70 and the linear motion guide 40B are coupled to each other via a coupling block 41B. Further, the polishing-tape supply and recovery mechanism 70 is coupled to a motor 42B and a ball screw 43B for moving the polishing-tape supply and recovery mechanism 70 along the linear motion guide 40B (i.e., in the radial direction of the substrate W). More specifically, the ball screw 43B is secured to the coupling block 41B, and the motor 42B is secured to the mount base 27 through a support member 44B. The motor 42B is configured to rotate a screw shaft of the ball screw 43B, so that the coupling block 41B and the polishing-tape supply and recovery mechanism 70 (which is coupled to the coupling block 41B) are moved along the linear motion guide 40B. The motor 42B, the ball screw 43B, and the linear motion guide 40B constitute a second moving mechanism for moving the polishing-tape supply and recovery mechanism 70 in the radial direction of the substrate W held on the substrate holder 3.

As shown in FIG. 12, the polishing head 50 has a pressing member 51 for pressing the polishing tape 38 against the substrate W, a pressing-member holder 52 that holds the pressing member 51, and an air cylinder 53 as an actuator configured to push down the pressing-member holder 52 (and the pressing member 51). The air cylinder 53 is held by a holding member 55. Further, the holding member 55 is coupled to an air cylinder 56 serving as a lifter via a linear motion guide 54 extending in a vertical direction. As a gas (e.g., air) is supplied to the air cylinder 56 from a non-illustrated gas supply source, the air cylinder 56 pushes up the holding member 55, whereby the holding member 55, the air cylinder 53, the pressing-member holder 52, and the pressing member 51 are elevated along the linear motion guide 54.

The air cylinder 56 is secured to a mount member 57 that is fixed to the coupling block 41A. The mount member 57 and the pressing-member holder 52 are coupled to each other via a linear motion guide 58 extending in the vertical direction. When the pressing-member holder 52 is pushed down by the air cylinder 53, the pressing member 51 is moved downward along the linear motion guide 58 to thereby press the polishing tape 38 against the peripheral portion of the substrate W. The pressing member 51 is made of resin (e.g., PEEK (polyetheretherketone)), metal (e.g., stainless steel), or ceramic (e.g., SiC (silicon carbide)).

The pressing member 51 has through-holes 51a extending in the vertical direction. A vacuum line 60 is coupled to the through-holes 51a. This vacuum line 60 has a valve (not shown in the drawings) therein. By opening this valve, a vacuum is produced in the through-holes 51a of the pressing member 51. When the vacuum is produced in the through-holes 51a with the pressing member 51 in contact with an upper surface of the polishing tape 38, this upper surface of the polishing tape 38 is held on a lower surface of the pressing member 51. Only one through-hole 51a may be provided in the pressing member 51.

The pressing-member holder 52, the air cylinder 53, the holding member 55, the air cylinder 56, and the mount member 57 are housed in a box 62. A lower portion of the pressing-member holder 52 projects from a bottom of the box 62, and the pressing member 51 is attached to this lower portion of the pressing-member holder 52. A position sensor 63 for detecting a vertical position of the pressing member 51 is disposed in the box 62. This position sensor 63 is mounted to the mount member 57. A dog 64, which serves as a sensor target, is provided on the pressing-member holder 52. The position sensor 63 is configured to detect the vertical position of the pressing member 51 based on the vertical position of the dog 64.

Figure 13:
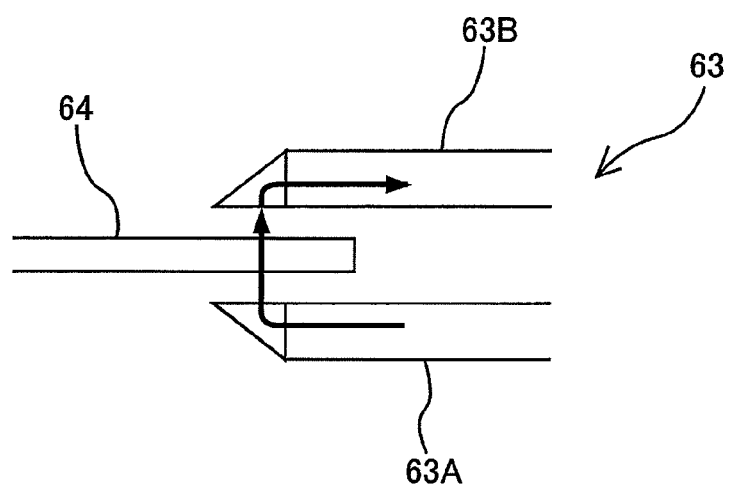
FIG. 13 is a view of a position sensor and a dog as viewed from above.

FIG. 13 is a view of the position sensor 63 and the dog 64 as viewed from above. The position sensor 63 has a light emitter 63A and a light receiver 63B. When the dog 64 is lowered together with the pressing-member holder 52 (and the pressing member 51), a part of light emitted from the light emitter 63A is interrupted by the dog 64. Therefore, the position of the dog 64, i.e., the vertical position of the pressing member 51, can be detected from a quantity of the light received by the light receiver 63B. The position sensor 63 shown in FIG. 13 is a so-called transmission optical sensor. However, another type of position sensor may be used.

The polishing-tape supply and recovery mechanism 70 has a supply reel 71 for supplying the polishing tape 38 and a recovery reel 72 for recovering the polishing tape 38. The supply reel 71 and the recovery reel 72 are coupled to tension motors 73 and 74, respectively. These tension motors 73 and 74 are configured to apply predetermined torque to the supply reel 71 and the recovery reel 72 to thereby exert a predetermined tension on the polishing tape 38.

A polishing-tape sending mechanism 76 is provided between the supply reel 71 and the recovery reel 72. This polishing-tape sending mechanism 76 has a tape-sending roller 77 for sending the polishing tape 38, a nip roller 78 that presses the polishing tape 38 against the tape-sending roller 77, and a tape-sending motor 79 for rotating the tape-sending roller 77. The polishing tape 38 is interposed between the tape-sending roller 77 and the nip roller 78. By rotating the tape-sending roller 77 in a direction indicated by arrow in FIG. 9, the polishing tape 38 is sent from the supply reel 71 to the recovery reel 72.

The tension motors 73 and 74 and the tape-sending motor 79 are mounted on a pedestal 81. This pedestal 81 is secured to the coupling block 41B. The pedestal 81 has two support arms 82 and 83 extending from the supply reel 71 and the recovery reel 72 toward the polishing head 50. A plurality of guide rollers 84A, 84B, 84C, 84D, and 84E for supporting the polishing tape 38 are provided on the support arms 82 and 83. The polishing tape 38 is guided by these guide rollers 84A to 84E so as to surround the polishing head 50.

The extending direction of the polishing tape 38 is perpendicular to the radial direction of the substrate W as viewed from above. The two guide rollers 84D and 84E, which are located below the polishing head 50, support the polishing tape 38 such that the polishing surface of the polishing tape 38 is parallel to the surface (upper surface) of the substrate W. Further, the polishing tape 38 extending between these guide rollers 84D and 84E is parallel to the tangential direction of the substrate W (i.e., a longitudinal axis of the polishing tape 38 extends in the tangential direction of substrate W). There is a clearance in the vertical direction between the polishing tape 38 and the substrate W.

The polishing apparatus further has a tape-edge detection sensor 100 for detecting a position of an edge of the polishing tape 38. This tape-edge detection sensor 100 is a transmission optical sensor, as well as the above-described position sensor 63. The tape-edge detection sensor 100 has a light emitter 100A and a light receiver 100B. The light emitter 100A is secured to the mount base 27 as shown in FIG. 8, and the light receiver 100B is secured to the base plate 21 that defines the polishing chamber 22 as shown in FIG. 6. This tape-edge detection sensor 100 is configured to detect the position of the edge of the polishing tape 38 based on a quantity of the light received by the light receiver 100B.

Figure 14:
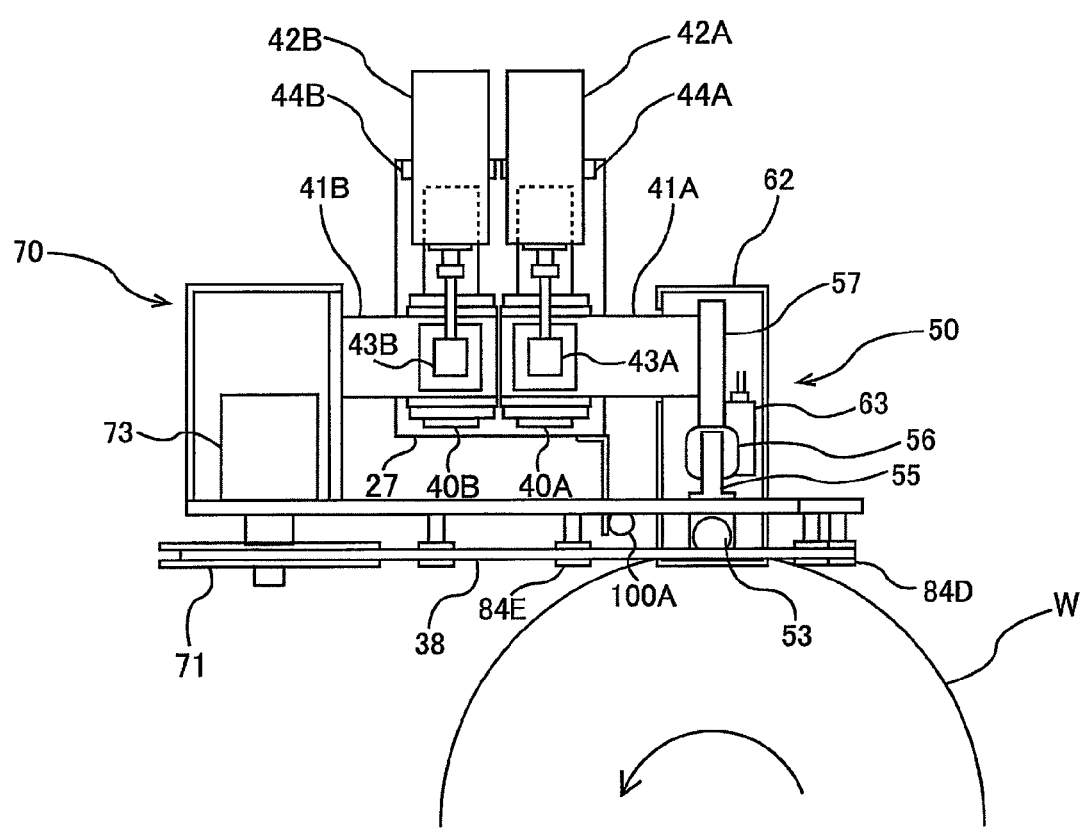
FIG. 14 is a view of the polishing head and the polishing-tape supply and recovery mechanism moved to predetermined polishing positions.
Figure 15:
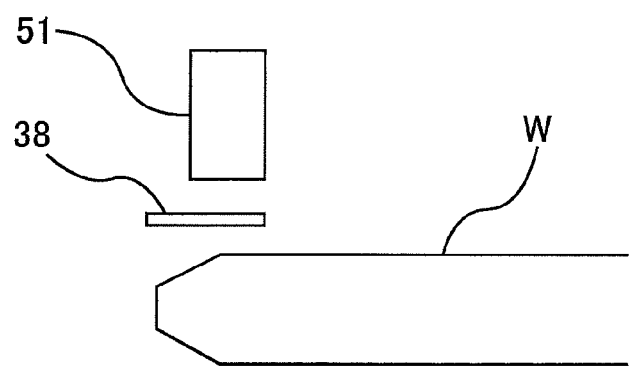
FIG. 15 is a schematic view of a pressing member, a polishing tape, and a substrate at the polishing positions as viewed from a lateral direction.
Figure 16:
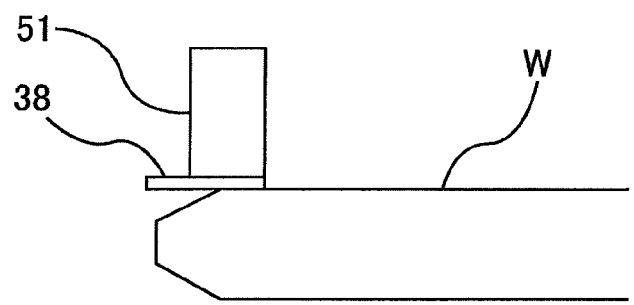
FIG. 16 is a view showing a state in which the pressing member is pressing the polishing tape against the substrate.

As shown in FIG. 14, when polishing the substrate W, the polishing head 50 and the polishing-tape supply and recovery mechanism 70 are moved to their predetermined polishing positions, respectively, by the motors 42A and 42B and the ball screws 43A and 43B. The polishing tape 38 at the polishing position extends in the tangential direction of the substrate W. FIG. 15 is a schematic view of the pressing member 51, the polishing tape 38, and the substrate W at the polishing positions as viewed from the lateral direction. As shown in FIG. 15, the polishing tape 38 is located above the peripheral portion of the substrate W, and the pressing member 51 is located above the polishing tape 38. FIG. 16 is a view showing a state in which the pressing member 51 is pressing the polishing tape 38 against the substrate W. As shown in FIG. 16, the edge of the pressing member 51 and the edge of the polishing tape 38 at their polishing positions coincide with each other. That is, the polishing head 50 and the polishing-tape supply and recovery mechanism 70 are moved independently to their respective polishing positions such that the edge of the pressing member 51 and the edge of the polishing tape 38 coincide with each other.

Next, polishing operations of the polishing apparatus having the above-described structures will be described. The following operations of the polishing apparatus are controlled by an operation controller 11 shown in FIG. 5. The substrate W is held by the substrate holder 3 such that a film (e.g., a device layer) formed on the surface thereof faces upward, and further the substrate W is rotated about its center. Liquid (e.g., pure water) is supplied to the center of the rotating substrate W from a liquid supply mechanism (not shown in the drawings). The pressing member 51 of the polishing head 50 and the polishing tape 38 are moved to the predetermined polishing positions, respectively, as shown in FIG. 15.

Figure 17A:
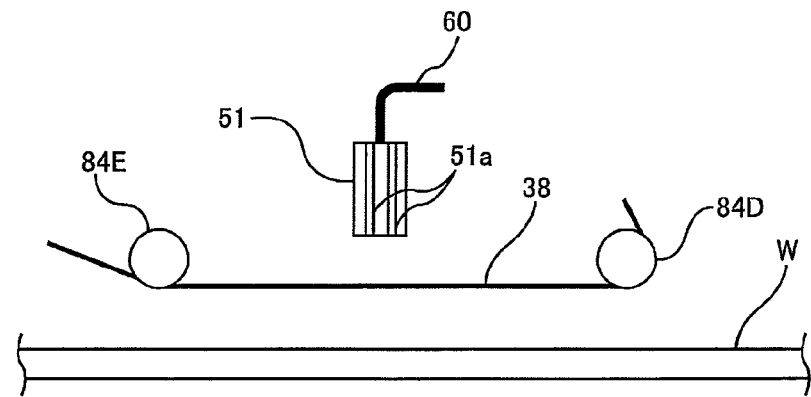
FIG. 17A is a view of the polishing tape and the pressing member at the polishing positions as viewed from a radial direction of the substrate.
Figure 17B:
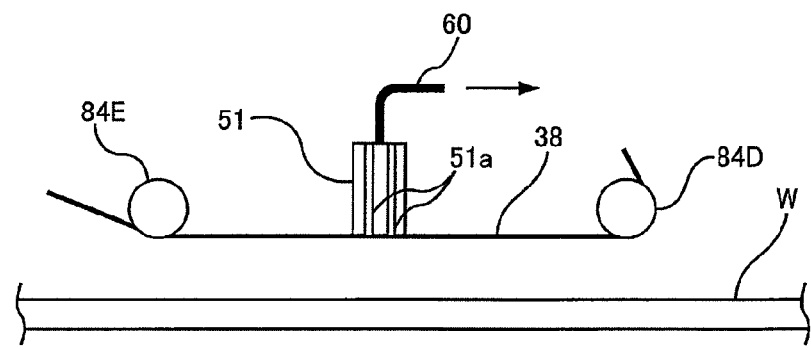
FIG. 17B is a view showing a state in which a lower surface of the pressing member is in contact with an upper surface of the polishing tape.
Figure 17C:
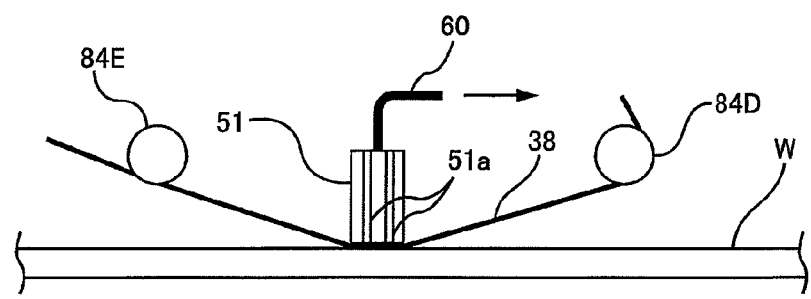
FIG. 17C is a view showing a state in which the pressing member is pressing the polishing tape against the substrate from above.

FIG. 17A is a view of the polishing tape 38 and the pressing member 51 at the polishing positions as viewed from the radial direction of the substrate W. The pressing member 51 shown in FIG. 17A is in an upper position as a result of being elevated by the air cylinder 56 (see FIG. 12). In this position, the pressing member 51 is located above the polishing tape 38. Subsequently, the operation of the air cylinder 56 is stopped and as a result a piston rod thereof is lowered. The pressing member 51 is lowered until its lower surface contacts the upper surface of the polishing tape 38 as shown in FIG. 17B. In this state, the vacuum is produced in the through-holes 51a of the pressing member 51 through the vacuum line 60 to enable the lower surface of the pressing member 51 to hold the polishing tape 38. While holding the polishing tape 38, the pressing member 51 is lowered by the air cylinder 53 (see FIG. 12) to press the polishing surface of the polishing tape 38 against the peripheral portion of the substrate W at a predetermined polishing load, as shown in FIG. 17C. The polishing load can be adjusted by the pressure of the gas supplied to the air cylinder 53.

The peripheral portion of the substrate W is polished by the sliding contact between the rotating substrate W and the polishing tape 38. In order to increase a polishing rate of the substrate W, the polishing tape 38 may be oscillated in the tangential direction of the substrate W by the polishing-unit moving mechanism 30 during polishing of the substrate W. During polishing, the liquid (e.g., pure water) is supplied onto the center of the rotating substrate W, so that the substrate W is polished in the presence of the water. The liquid, supplied to the substrate W, spreads over the upper surface of the substrate W in its entirety via a centrifugal force. This liquid can prevent polishing debris from contacting devices of the substrate W formed thereon. As described above, during polishing, the polishing tape 38 is held by the pressing member 51 via the vacuum suction. Therefore, a relative change in position between the polishing tape 38 and the pressing member 51 is prevented. As a result, the polishing positions and a polishing profile can be stable. Further, even when the polishing load is increased, the relative position between the polishing tape 38 and the pressing member 51 does not change. Therefore, a polishing time can be shortened.

Figure 1A:
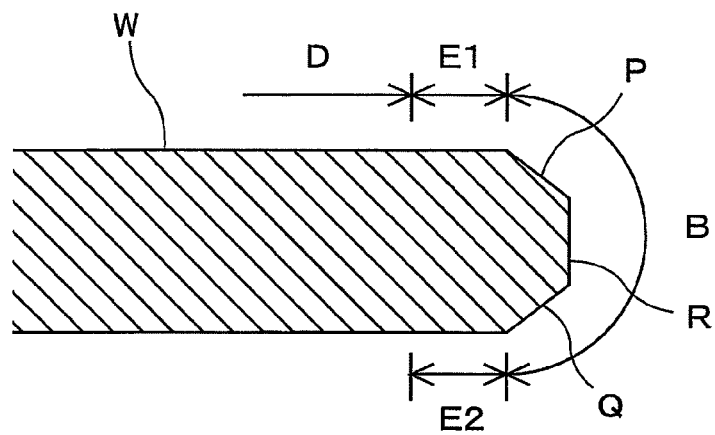
FIG. 1A and FIG. 1B are views each showing a peripheral portion of a substrate.
Figure 1B:
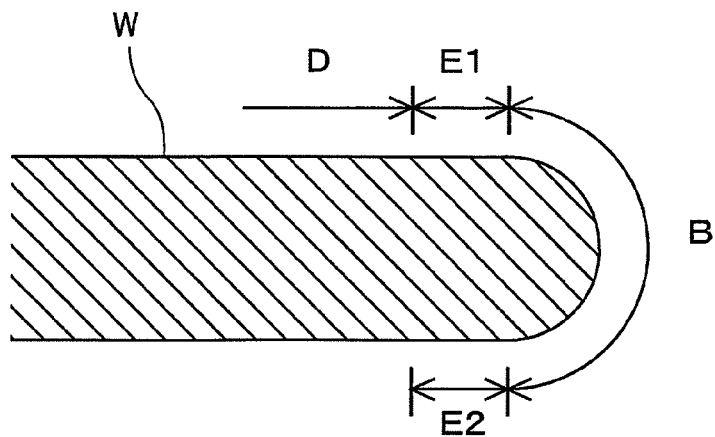
Figure 2:
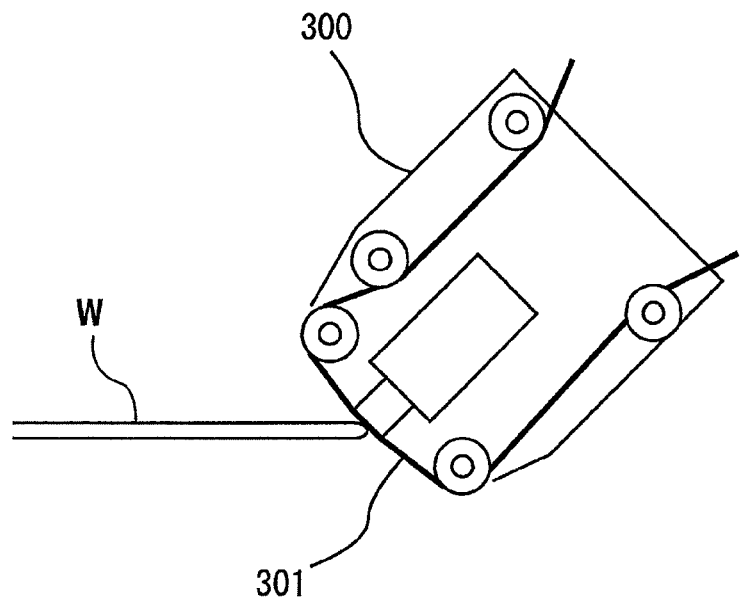
FIG. 2 is a schematic view showing a conventional method of polishing the peripheral portion of the substrate.
Figure 3:
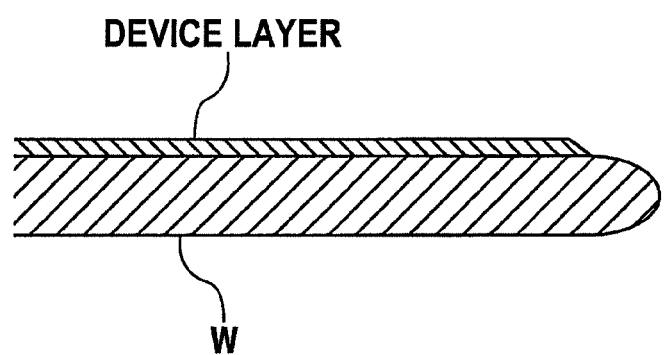
FIG. 3 is a cross-sectional view of the substrate polished by the method shown in FIG. 2.
Figure 4A:
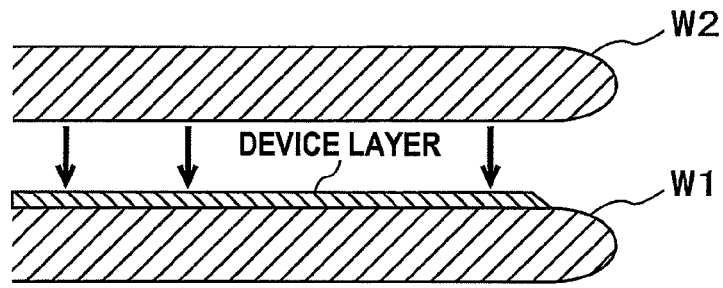
FIG. 4A through FIG. 4D are views illustrating fabrication processes of an SOI substrate.
Figure 4B:
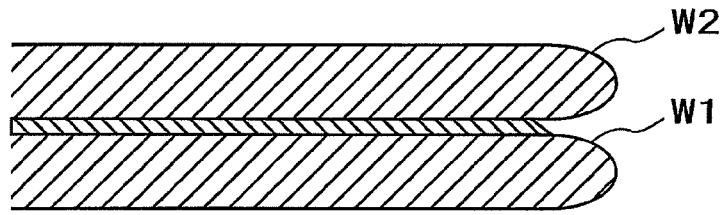
Figure 4C:
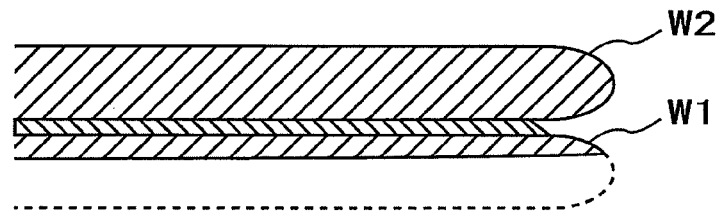
Figure 4D:
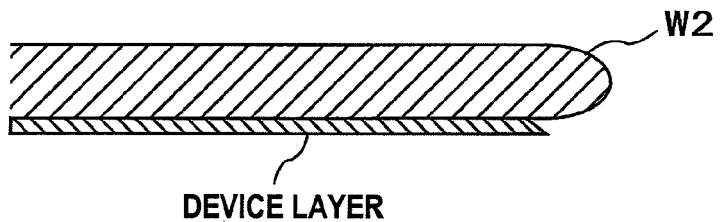
Figure 18:
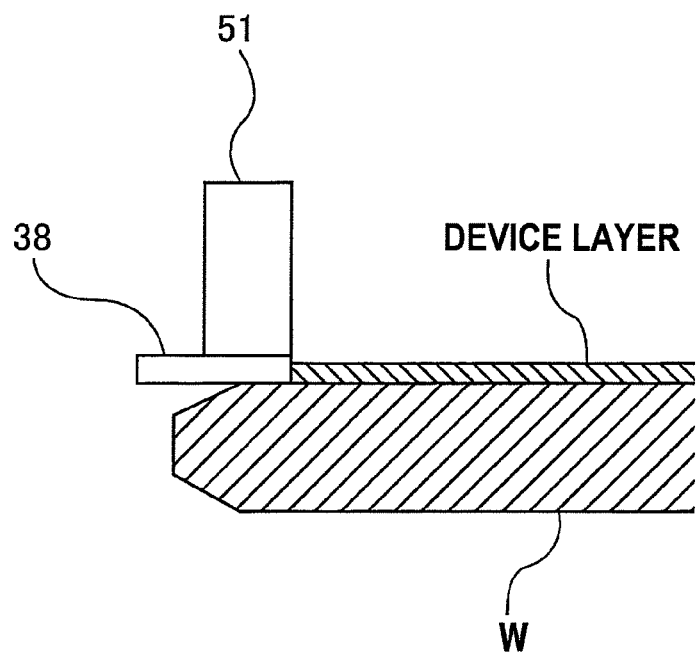
FIG. 18 is an enlarged view showing the peripheral portion of the substrate when being polished by the polishing tape.
Figure 19:
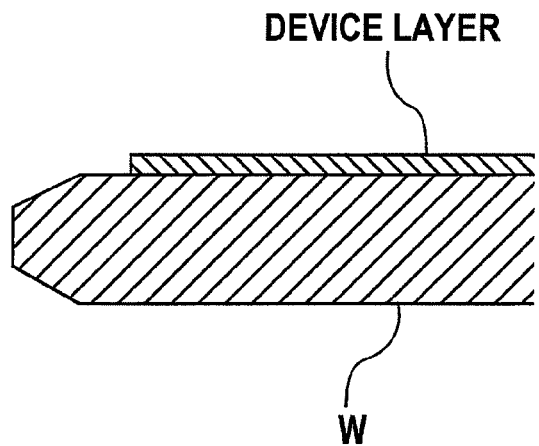
FIG. 19 is a cross-sectional view showing a cross-sectional shape of the peripheral portion of the polished substrate.

Because the polishing tape 38 is pressed from above by the pressing member 51, the polishing tape 38 can polish the top edge portion of the substrate W (see FIG. 1A and FIG. 1B). FIG. 18 is an enlarged view showing the peripheral portion of the substrate W when being polished by the polishing tape 38. As shown in FIG. 18, a flat portion, including the edge, of the polishing tape 38 is pressed against the peripheral portion of the substrate W, with the edge of the polishing tape 38 and the edge of the pressing member 51 coinciding with each other. The edge of the polishing tape 38 is a right-angled corner. This right-angled edge of the polishing tape 38 is pressed against the peripheral portion of the substrate W from above by the edge of the pressing member 51 and against the peripheral edge of the device layer of the substrate. Thus, as shown in FIG. 18, the edge of the polishing tape contacts a circular boundary (in this case, the edge of the device layer) between a region to be polished (in this case, the peripheral upper surface of a base portion of substrate W) and a region not to be polished (in this case, the upper surface of the device layer portion of the substrate W). Therefore, as shown in FIG. 19, the polished substrate W can have a right-angled cross-sectional shape. That is, the device layer can have the edge surface perpendicular to the surface of the substrate W.

The vertical position of the pressing member 51 during polishing of the substrate W is detected by the position sensor 63. Therefore, a polishing end point can be detected from the vertical position of the pressing member 51. For example, polishing of the peripheral portion of the substrate W can be terminated when the vertical position of the pressing member 51 has reached a predetermined target position. This target position is determined according to a target amount of polishing.

When polishing of the substrate W is terminated, supply of the gas to the air cylinder 53 is stopped, whereby the pressing member 51 is elevated to the position shown in FIG. 17B. At the same time, the vacuum suction of the polishing tape 38 is stopped. Further, the pressing member 51 is elevated by the air cylinder 56 to the position shown in FIG. 17A. The polishing head 50 and the polishing-tape supply and recovery mechanism 70 are moved to the retreat positions shown in FIG. 8. The polished substrate W is elevated by the substrate holder 3 and transported to the exterior of the polishing chamber 22 by hands of a non-illustrated transporting mechanism. Before polishing of the next substrate is started, the polishing tape 38 is sent from the supply reel 71 to the recovery reel 72 by a predetermined distance by the tape-sending mechanism 76, so that a new polishing surface is used for polishing of the next substrate. When the polishing tape 38 is estimated to be clogged with the polishing debris, the polished substrate W may be polished again with the new polishing surface after the polishing tape 38 is sent by the predetermined distance. Clogging of the polishing tape 38 can be estimated from, for example, the polishing time and the polishing load. Polishing of the substrate W may be performed while sending the polishing tape 38 at a predetermined speed by the tape-sending mechanism 76. In this case, it is not necessary to hold the polishing tape 38 by the vacuum suction.

The polishing tape 38 is a long and narrow strip-shaped polishing tool. Although a width of the polishing tape 38 is basically constant throughout its entire length, there may be a slight variation in the width of the polishing tape 38 in some parts thereof. As a result, the position of the edge of the polishing tape 38 at its polishing position may vary from substrate to substrate. On the other hand, the position of the pressing member 51 at its polishing position is constant at all times. Thus, in order to enable the edge of the polishing tape 38 to coincide with the edge of the pressing member 51, the position of the edge of the polishing tape 38 is detected by the above-described tape-edge detection sensor 100 before the polishing tape 38 is moved to its polishing position.

Figure 20A:
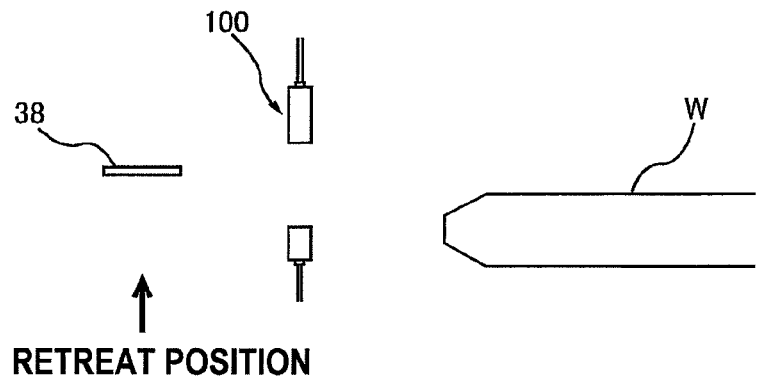
FIG. 20A through FIG. 20C are views illustrating operations for detecting an edge of the polishing tape.
Figure 20B:
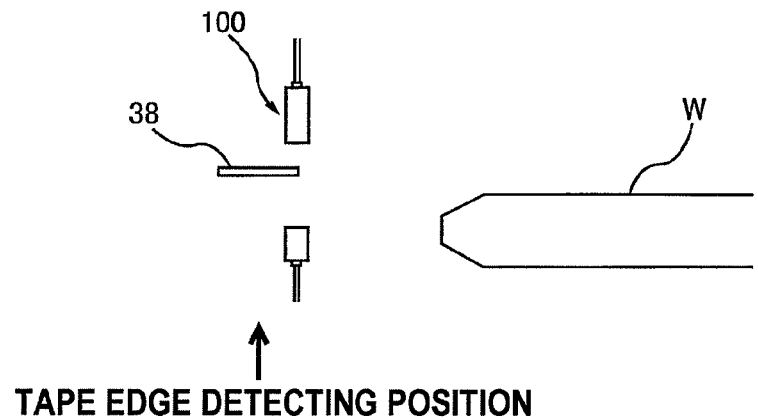
Figure 20C:
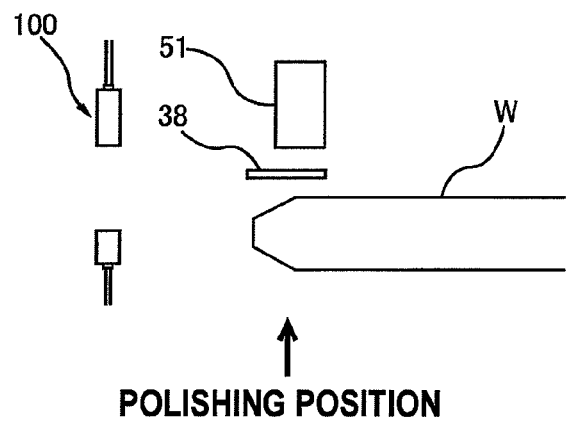

FIG. 20A through FIG. 20C are views illustrating operations for detecting the edge of the polishing tape 38. Prior to polishing of the substrate W, the polishing tape 38 is moved from a retreat position shown in FIG. 20A to a tape-edge detecting position shown in FIG. 20B. In this tape-edge detecting position, the position of the substrate-side edge of the polishing tape 38 is detected by the tape-edge detection sensor 100. Then, as shown in FIG. 20C, the polishing tape 38 is moved to the polishing position such that the edge of the polishing tape 38 coincides with the edge of the pressing member 51. Because the polishing tape 38 is movable independently of the polishing head 50, the polishing tape 38 can be moved by a distance that can vary depending on the width of the polishing tape 38.

The position of the edge of the pressing member 51 at the polishing position is stored in advance in the operation controller 11 (see FIG. 5). Therefore, the operation controller 11 can calculate the travel distance of the polishing tape 38 for allowing the edge of the polishing tape 38 to coincide with the edge of the pressing member 51 from the detected edge position of the polishing tape 38 and the edge position of the pressing member 51. In this manner, the travel distance of the polishing tape 38 is determined based on the detected position of the edge of the polishing tape 38. Therefore, the edge of the polishing tape 38 can be aligned on the edge of the pressing member 51. As a result, the edge of the polishing tape 38 can form the right-angled cross-sectional shape in the substrate W.

Figure 21:
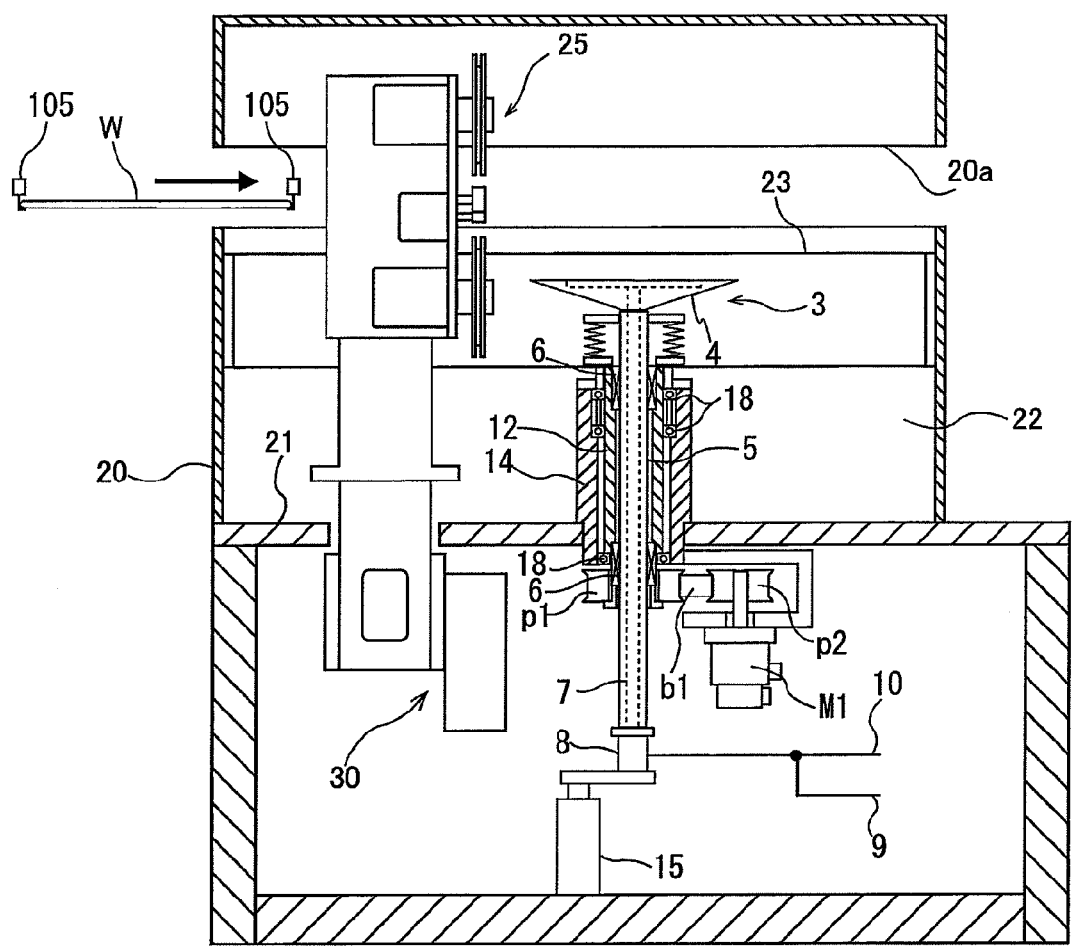
FIG. 21 is a view showing a manner in which the substrate is transported into the polishing apparatus.
Figure 22:
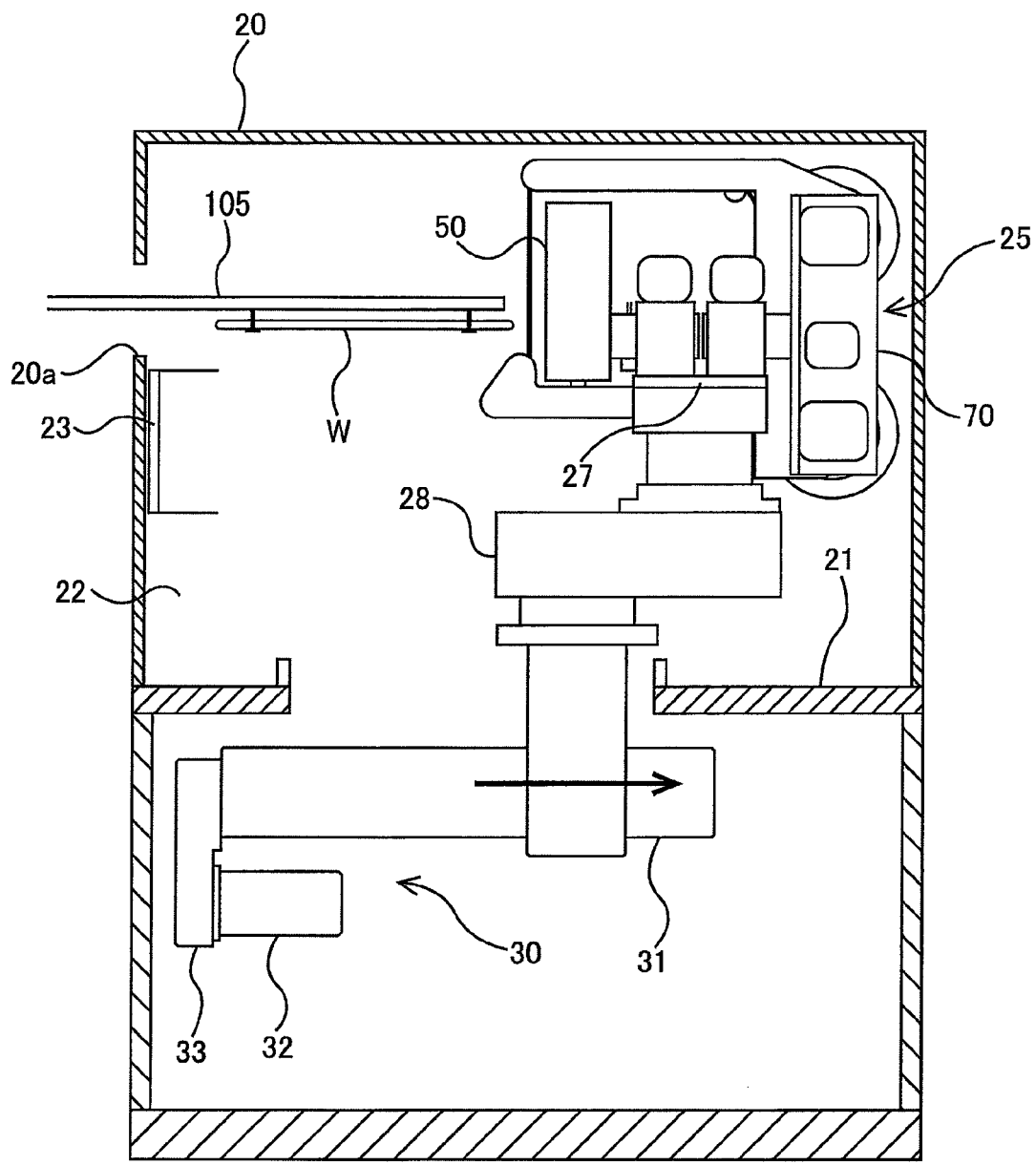
FIG. 22 is a view showing a manner in which a polishing unit is moved to a retreat position.

As shown in FIG. 5 through FIG. 7, the partition 20 has an entrance 20a through which the substrate W is transported into and removed from the polishing room 22. The entrance 20a is in the form of a horizontally extending cutout. This entrance 20a can be closed by a shutter 23. As shown in FIG. 21, the substrate W to be polished is transported into the polishing chamber 22 through the entrance 20a by hands 105 of a transporting mechanism, with the shutter 23 opened. As shown in FIG. 22, the polishing unit 25 is moved to the retreat position by the above-described polishing-unit moving mechanism 30 so that the substrate W does not bump into the polishing unit 25.

Figure 23:
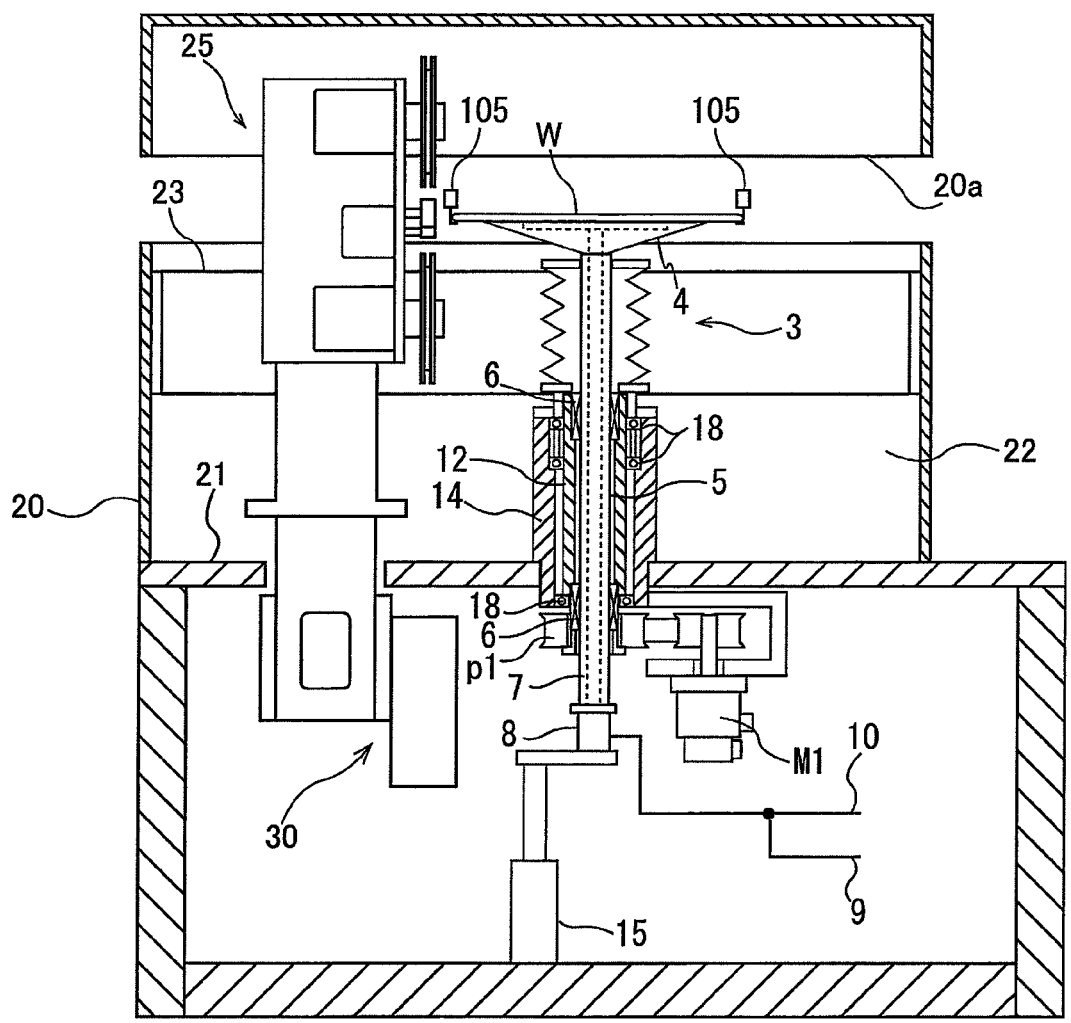
FIG. 23 is a view showing a manner in which the substrate is held by a holding stage.

After the substrate W is transported into the polishing chamber 22, the air cylinder 15 elevates the holding stage 4 as shown in FIG. 23, so that the substrate W is held on the upper surface of the holding stage 4. Thereafter, the holding stage 4 is lowered, together with the substrate W, to the predetermined polishing position. FIG. 6 shows that the substrate W is in the polishing position. Then the polishing unit 25 is moved from the retreat position shown in FIG. 22 to the substrate polishing position shown in FIG. 7, and polishes the substrate W in a manner as described above. During polishing of the substrate W, the entrance 20a is closed by the shutter 23.

Figure 24:
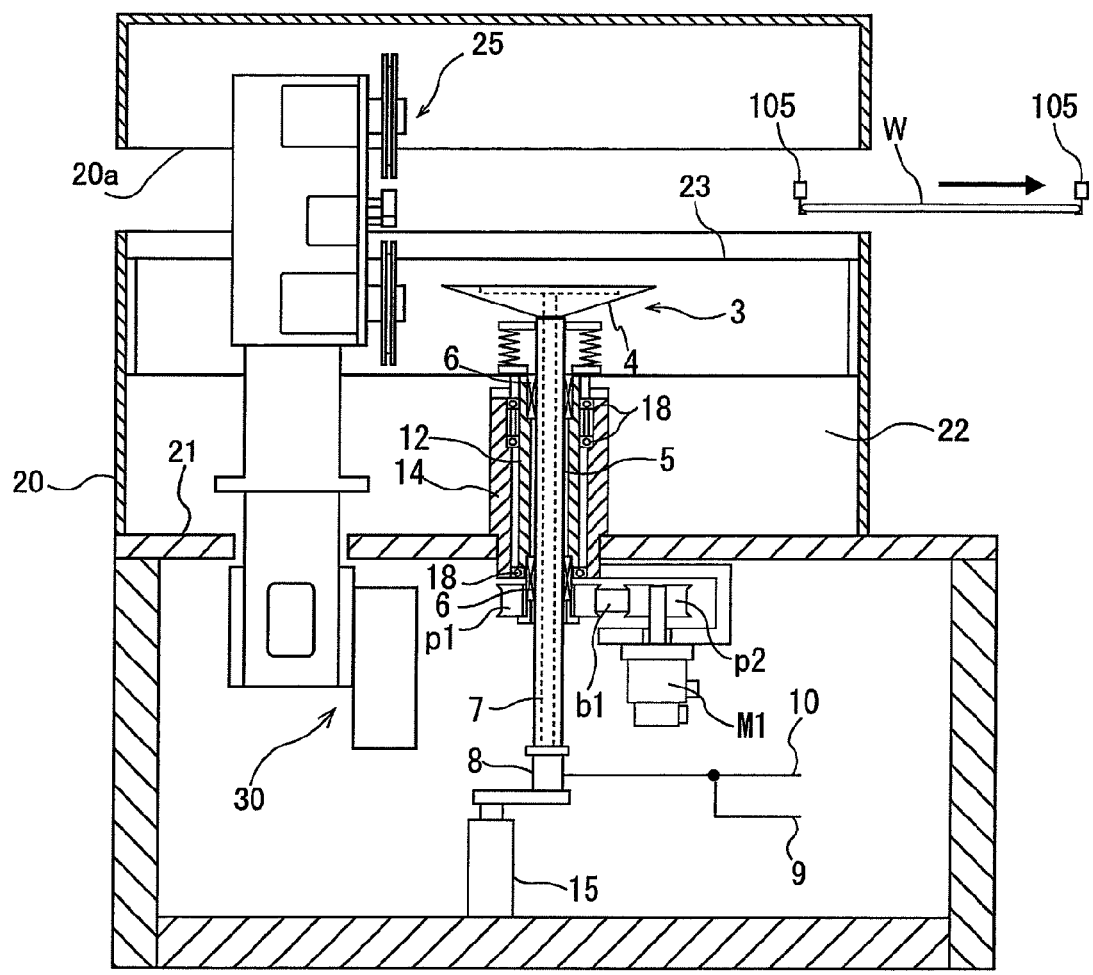
FIG. 24 is a view showing a manner in which the substrate is removed from the polishing apparatus.

After polishing of the substrate W is completed, the polishing unit 25 is moved to the retreat position shown in FIG. 22 again by the above-described polishing-unit moving mechanism 30. Thereafter, the hands 105 enter the polishing chamber 22. Further, the holding stage 4, together with the substrate W, is elevated again to a substrate transfer position shown in FIG. 23. The hands 105 grasp the substrate W and remove the substrate W from the polishing chamber 22 as shown in FIG. 24. In this manner, the substrate W, held by the hands 105, can travel across the polishing chamber 22 through the entrance 20a while keeping its horizontal position.

Figure 25:
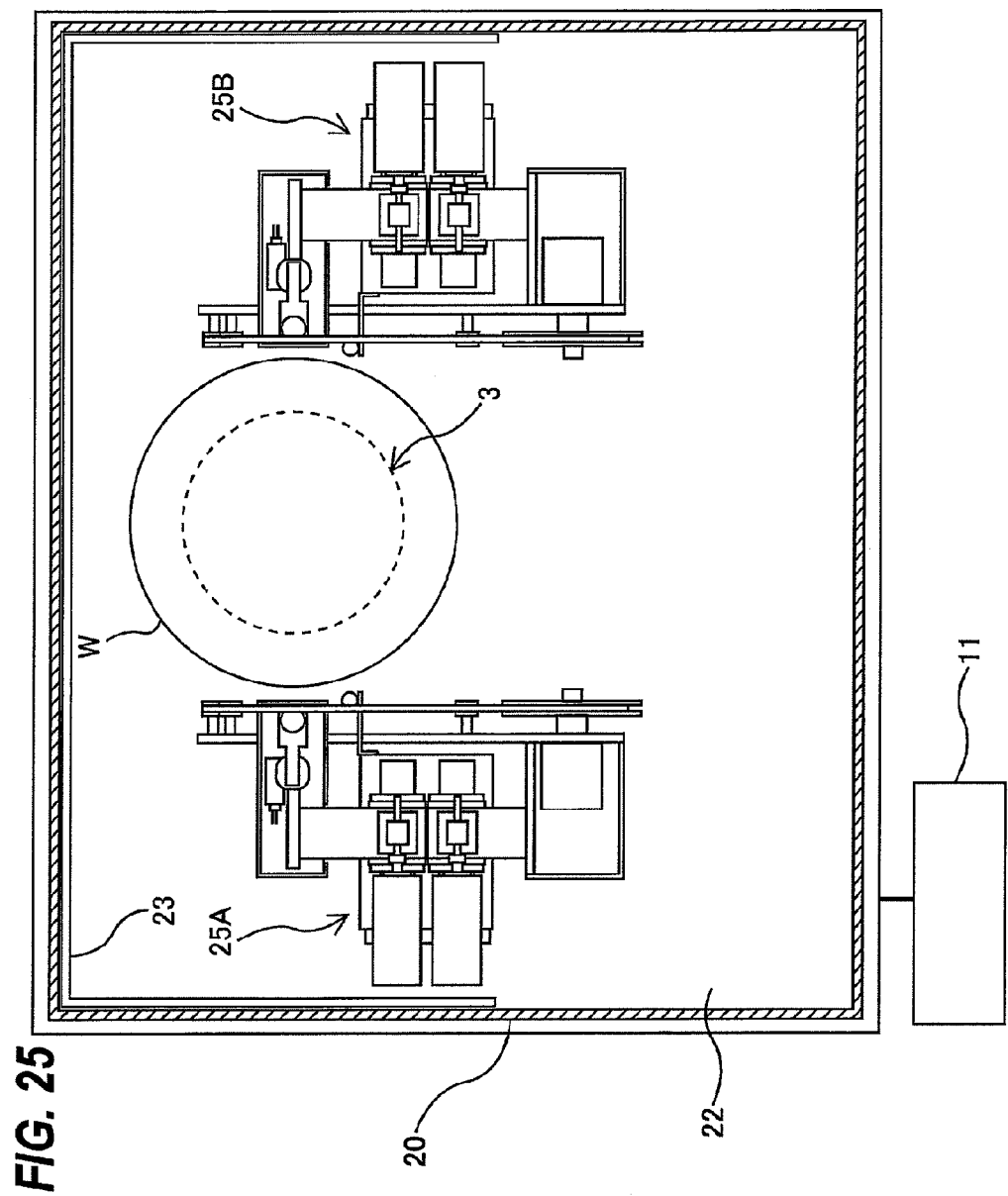
FIG. 25 is a plan view showing the polishing apparatus having multiple polishing units.

FIG. 25 is a plan view showing the polishing apparatus having multiple polishing units with the above-discussed structures. In this polishing apparatus, a first polishing unit 25A and a second polishing unit 25B are provided in the polishing chamber 22. These polishing units 25A and 25B are symmetrical about the substrate W held by the substrate holder 3. The first polishing unit 25A is movable by a first polishing-unit moving mechanism (not shown in the drawings), and the second polishing unit 25B is movable by a second polishing-unit moving mechanism (not shown in the drawings). These first and second polishing-unit moving mechanisms have the same structures as those of the above-described polishing-unit moving mechanism 30.

Different types of polishing tapes can be used in the first polishing unit 25A and the second polishing unit 25B. For example, rough polishing may be performed in the first polishing unit 25A and finish polishing may be performed in the second polishing unit 25B.

Figure 26:
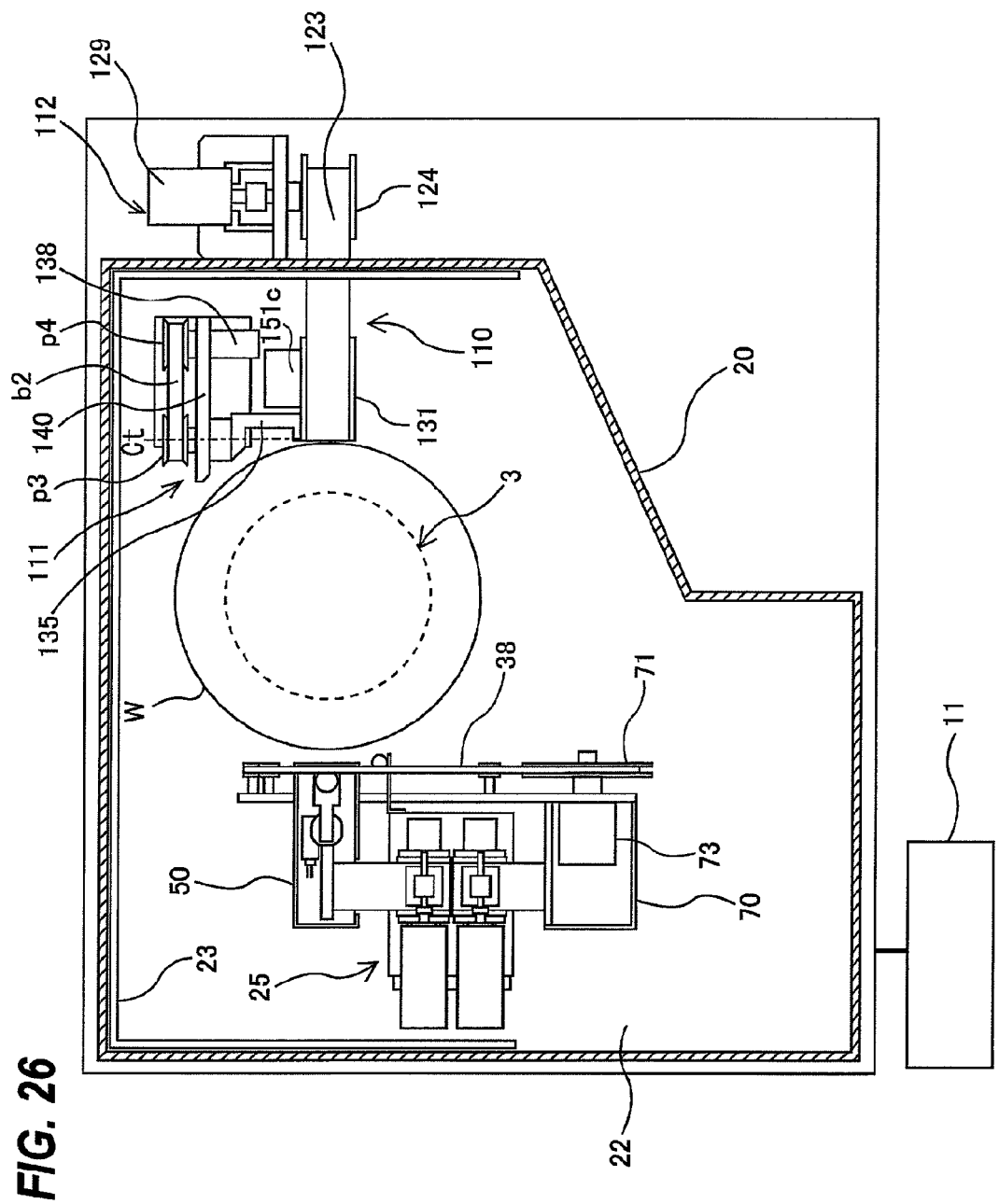
FIG. 26 is a plan view of the polishing apparatus having a top-edge polishing unit and a bevel polishing unit.
Figure 27:
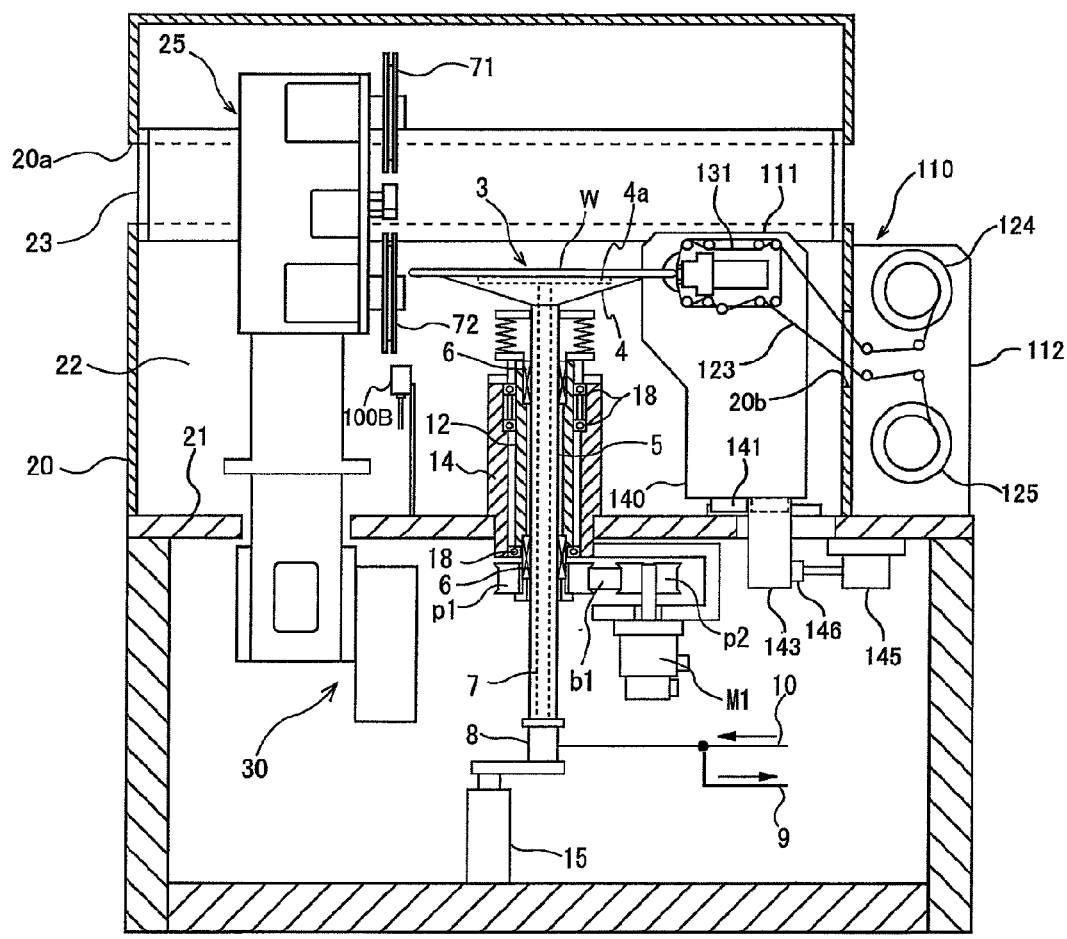
FIG. 27 is a vertical cross-sectional view of the polishing apparatus shown in FIG. 26.

FIG. 26 is a view showing a polishing apparatus having the above-described polishing unit 25 capable of polishing the top edge portion (hereinafter, the polishing unit 25 will be referred to as top-edge polishing unit) and a bevel polishing unit 110 capable of polishing the bevel portion (see the symbol B in FIG. 1A and FIG. 1B). FIG. 27 is a vertical cross-sectional view of the polishing apparatus shown in FIG. 26.

As shown in FIG. 26 and FIG. 27, the bevel polishing unit 110 has a polishing head assembly 111 configured to press a polishing tape 123 against the bevel portion of the substrate W so as to polish the bevel portion, and a polishing-tape supply and recovery mechanism 112 for supplying the polishing tape 123 to the polishing head assembly 111. The polishing head assembly 111 is located in the polishing chamber 22, while the polishing-tape supply and recovery mechanism 112 is located outside the polishing chamber 22.

The polishing-tape supply and recovery mechanism 112 has a supply reel 124 for supplying the polishing tape 123 to the polishing head assembly 111, and a recovery reel 125 for recovering the polishing tape 123 that has been used in polishing of the substrate W. Motors 129 and 129 are coupled to the supply reel 124 and the recovery reel 125, respectively (FIG. 26 shows only the motor 129 coupled to the supply reel 124). The motors 129 and 129 are configured to apply predetermined torque to the supply reel 124 and the recovery reel 125 so as to exert a predetermined tension on the polishing tape 123.

The polishing head assembly 111 has a polishing head 131 for pressing the polishing tape 123 against the peripheral portion of the substrate W. The polishing tape 123 is supplied to the polishing head 131 such that a polishing surface of the polishing tape 123 faces the substrate W. The polishing tape 123 is supplied to the polishing head 131 from the supply reel 124 through an opening 20b formed in the partition 20, and the polishing tape 123 that has been used in polishing of the substrate is recovered by the recovery reel 125 through the opening 20b.

The polishing head 131 is secured to one end of an arm 135, which is rotatable about an axis Ct extending parallel to the tangential direction of the substrate W. The other end of the arm 135 is coupled to a motor 138 via pulleys p3 and p4 and a belt b2. As the motor 138 rotates in a clockwise direction and a counterclockwise direction through a certain angle, the arm 135 rotates about the axis Ct through a certain angle. In this embodiment, the motor 138, the arm 135, the pulleys p3 and p4, and the belt b2 constitute a tilting mechanism for tilting the polishing head 131 with respect to the surface of the substrate W.

The tilting mechanism is mounted on a movable base 140. This movable base 140 is movably coupled to the base plate 21 via linear motion guides 141. The linear motion guides 141 extend linearly in the radial direction of the substrate W held on the substrate holder 3, so that the movable base 140 can move linearly in the radial direction of the substrate W. A connection plate 143, extending through the base plate 21, is secured to the movable base 140. A linear actuator 145 is coupled to the connection plate 143 via a joint 146. This linear actuator 145 is secured to the base plate 21 directly or indirectly.

The linear actuator 145 may comprise an air cylinder or a combination of a positioning motor and a ball screw. The linear actuator 145 and the linear motion guides 141 constitute a moving mechanism for linearly moving the polishing head 131 in the radial direction of the substrate W. Specifically, the moving mechanism is operable to move the polishing head 131 closer to and away from the substrate W along the linear motion guides 141. In contrast, the polishing-tape supply mechanism 112 is fixed to the base plate 21.

Figure 28:
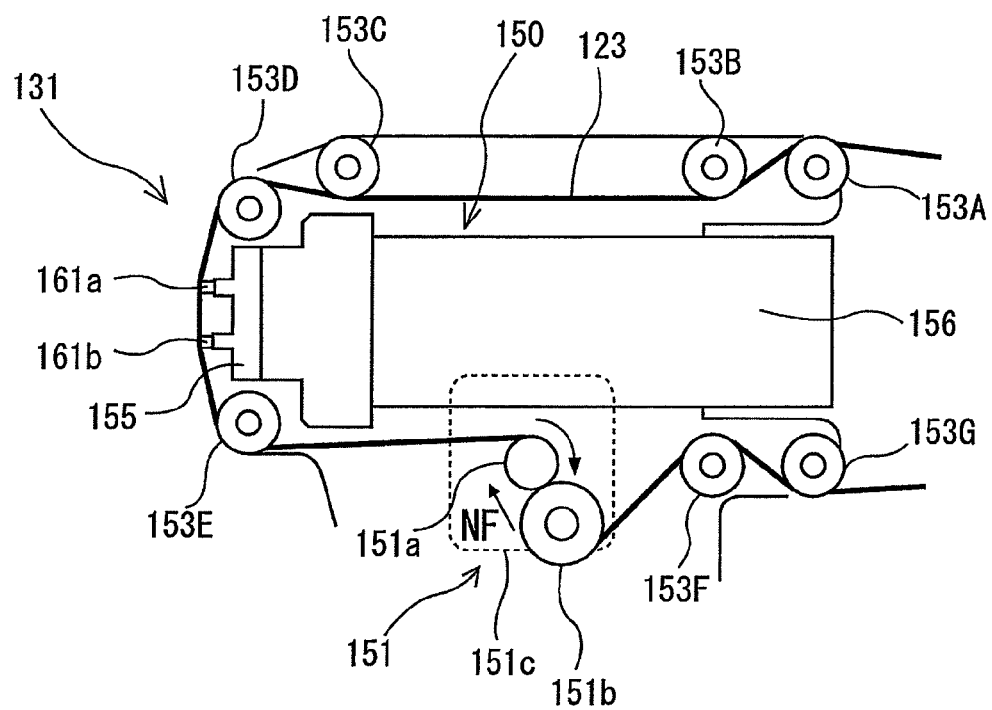
FIG. 28 is an enlarged view of a polishing head shown in FIG. 27.

FIG. 28 is an enlarged view of the polishing head 131 shown in FIG. 27. As shown in FIG. 28, the polishing head 131 has a pressing mechanism 150 configured to press the polishing surface of the polishing tape 123 against the substrate W with predetermined force. The polishing head 131 further has a tape-sending mechanism 151 configured to send the polishing tape 123 from the supply reel 124 to the recovery reel 125. The polishing head 131 has plural guide rollers 153A, 153B, 153C, 153D, 153E, 153F, and 153G, which guide the polishing tape 123 such that the polishing tape 123 travels in a direction perpendicular to the tangential direction of the substrate W.

The tape-sending mechanism 151 of the polishing head 131 includes a tape-sending roller 151a, a nip roller 151b, and a motor 151c configured to rotate the tape-sending roller 151a. The motor 151c is mounted on a side surface of the polishing head 131. The tape-sending roller 151a is provided on a rotational shaft of the motor 151c. The nip roller 151b is adjacent to the tape-sending roller 151a. The nip roller 151b is supported by a non-illustrated mechanism, which biases the nip roller 151b in a direction indicated by arrow NF in FIG. 28 (i.e., in a direction toward the tape-sending roller 151a) so as to press the nip roller 151b against the tape-sending roller 151a.

As the motor 151c rotates in a direction indicated by arrow in FIG. 28, the tape-sending roller 151a is rotated to send the polishing tape 123 from the supply reel 124 to the recovery reel 125 via the polishing head 131. The nip roller 151b is configured to be rotatable about its own axis.

The pressing mechanism 150 includes a pressing member 155 located at the rear side of the polishing tape 123 and an air cylinder 156 configured to move the pressing member 155 toward the peripheral portion of the substrate W. The polishing load on the substrate W is regulated by controlling air pressure supplied to the air cylinder 156.

Figure 29:
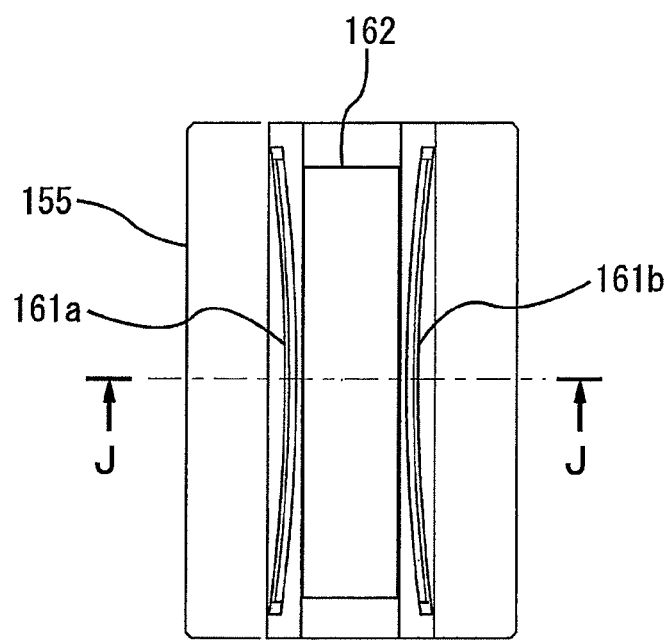
FIG. 29 is a front view of a pressing member shown in FIG. 28.
Figure 30:
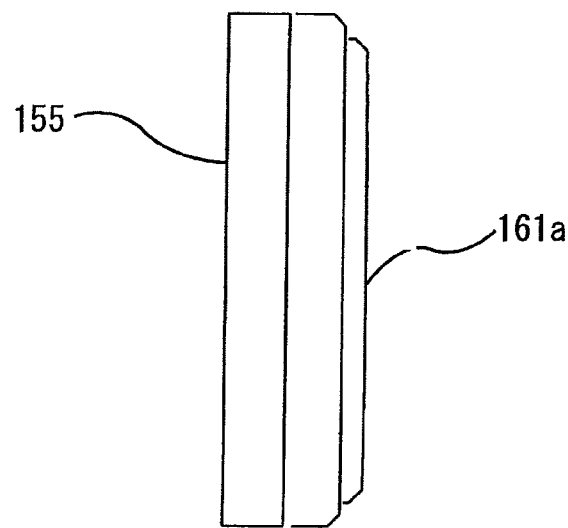
FIG. 30 is a side view of the pressing member shown in FIG. 29.
Figure 31:
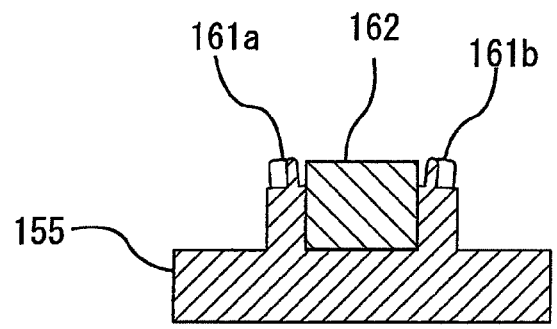
FIG. 31 is a cross-sectional view taken along line J-J in FIG. 29.

FIG. 29 is a front view of the pressing member 155 shown in FIG. 28, FIG. 30 is a side view of the pressing member 155 shown in FIG. 29, and FIG. 31 is a cross-sectional view taken along line J-J in FIG. 29. As shown in FIG. 29 through FIG. 31, the pressing member 155 has two protrusions 161a and 161b formed on a front surface thereof. These protrusions 161a and 161b are in a shape of rail and are arranged in parallel. The protrusions 161a and 161b are curved along the circumferential direction of the substrate W. More specifically, the protrusions 161a and 161b have a circular arc shape whose curvature is substantially the same as a curvature of the substrate W.

The two protrusions 161a and 161b are symmetrical about the rotational axis Ct. As shown in FIG. 29, the protrusions 161a and 161b are curved inwardly toward the rotational axis Ct as viewed from a front of the pressing member 155. The polishing head 131 is disposed such that a center line (i.e., the rotational axis Ct) extending between tip ends of the protrusions 161a and 161b coincides with a center of a thickness of the substrate W. The protrusions 161a and 161b are arranged such that the protrusions 161a and 161b are closer to the substrate W than the guide rollers 153D and 153E that are disposed at the front of the polishing head 131, so that the polishing tape 123 is supported from the rear side thereof by the protrusions 161a and 161b. The protrusions 161a and 161b are made from resin, such as PEEK (polyetheretherketone).

A pressing pad (bevel pad) 162 is provided between the two protrusions 161a and 161b. This pressing pad 162 is made from closed-cell foam material (e.g., silicone rubber) having elasticity. A height of the pressing pad 162 is slightly lower than a height of the protrusions 161a and 161b. When the pressing member 155 is moved toward the substrate W by the air cylinder 156 with the polishing head 131 in the horizontal position, the pressing pad 162 presses the polishing tape 123 from the rear side thereof against the bevel portion of the substrate W.

Figure 32:
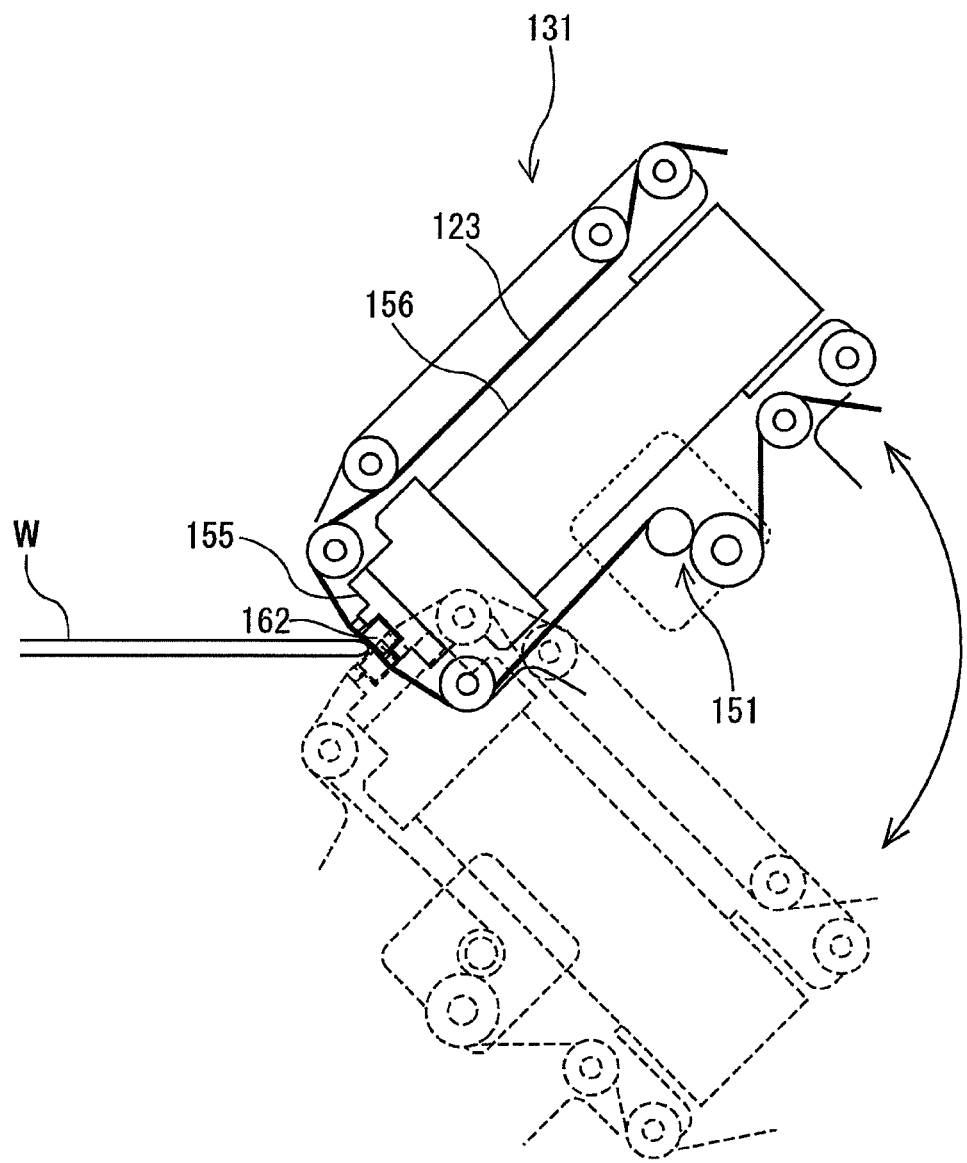
FIG. 32 is a view of the bevel polishing unit when polishing a bevel portion of the substrate.
Figure 33:
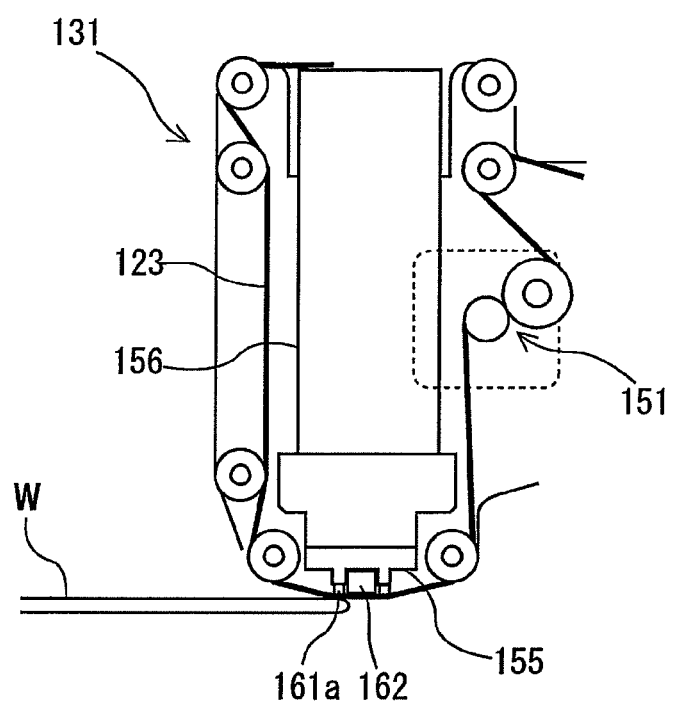
FIG. 33 is a view of the bevel polishing unit when polishing a top edge portion of the substrate.
Figure 34:
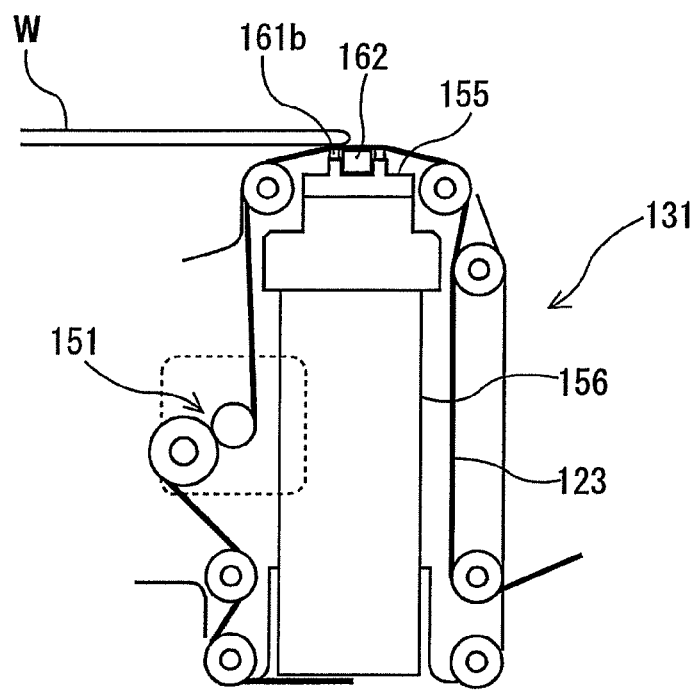
FIG. 34 is a view of the bevel polishing unit when polishing a bottom edge portion of the substrate.

When polishing the bevel portion of the substrate W, the polishing tape 123 is pressed against the bevel portion by the pressing pad 162 while a tilt angle of the polishing head 131 is changed continuously by the above-described tilting mechanism, as shown in FIG. 32. During polishing, the polishing tape 123 is sent at a predetermined speed by the tape-sending mechanism 151. Further, the polishing head 131 is capable of polishing the top edge portion and the bottom edge portion of the substrate W. Specifically, as shown in FIG. 33, the polishing head 131 is inclined upward to allow the protrusion 161a to press the polishing tape 123 against the top edge portion of the substrate W to thereby polish the top edge portion. Subsequently, as shown in FIG. 34, the polishing head 131 is inclined downward to allow the protrusion 161b to press the polishing tape 123 against the bottom edge portion of the substrate W to thereby polish the bottom edge portion.

The polishing apparatus shown in FIG. 26 and FIG. 27 is configured to be able to polish the peripheral portion of the substrate W in its entirety including the top edge portion, the bevel portion, and the bottom edge portion. For example, the bevel polishing unit 110 polishes the bevel portion of the substrate W, and subsequently the top-edge polishing unit 25 polishes the top edge portion of the substrate W. In this polishing apparatus, the top edge portion of the substrate W may be polished using either one or both of the top-edge polishing unit 25 and the bevel polishing unit 110. Although not shown in the drawings, multiple bevel polishing units 110 may be provided.

Figure 35:
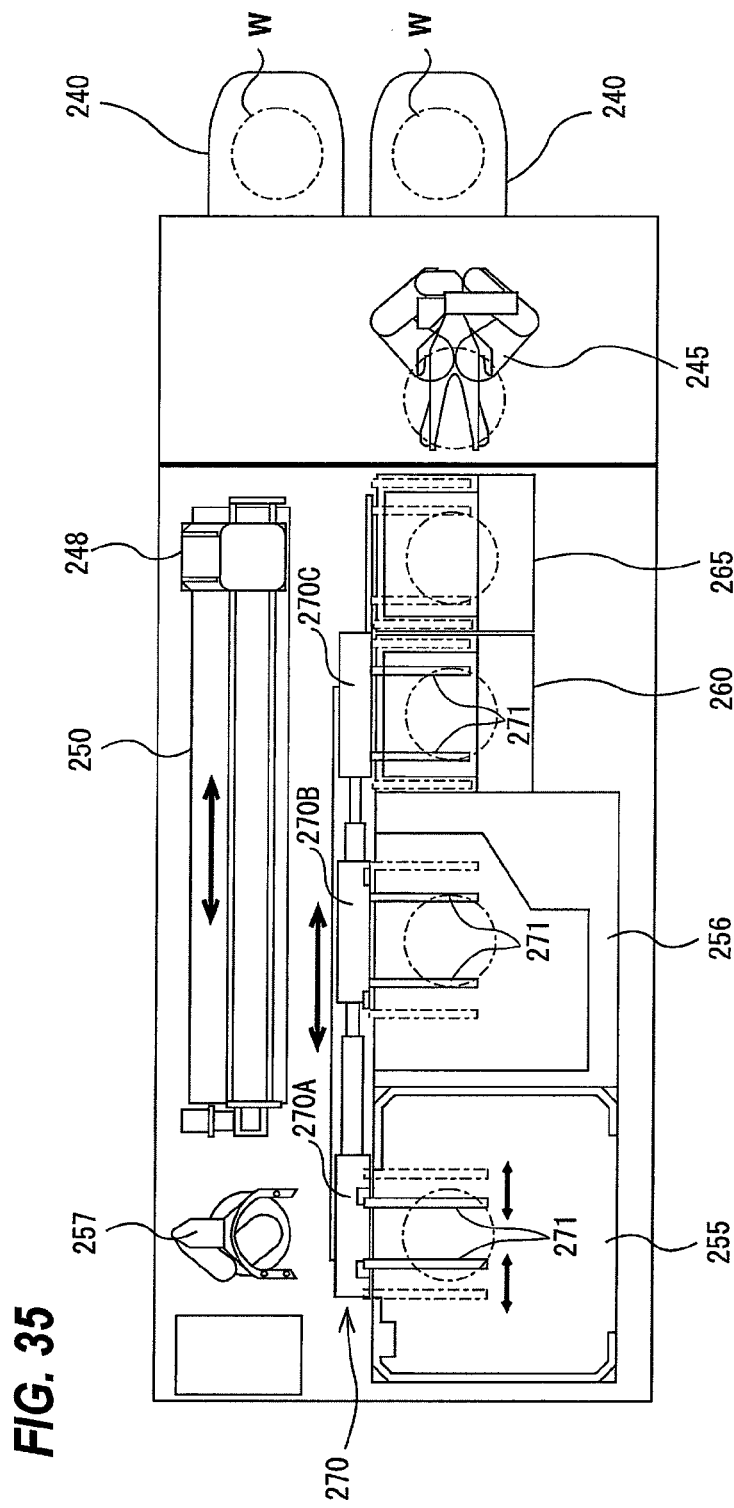
FIG. 35 is a top view of a substrate processing apparatus having a plurality of substrate processing modules including a polishing module.

FIG. 35 is a top view of a substrate processing apparatus having a plurality of substrate processing modules including a polishing module. This substrate processing apparatus includes two loading ports 240 configured to introduce the substrate W into the substrate processing apparatus, a first transfer robot 245 configured to remove the substrate W from wafer cassettes (not shown in the drawing) on the loading ports 240, a notch aligner 248 configured to detect the position of a notch portion of the substrate W and to rotate the substrate W such that the notch portion is in a predetermined position, a notch-aligner moving mechanism 250 configured to move the notch aligner 248, a notch polishing module (a first polishing module) 255 configured to polish the notch portion of the substrate W, a second transfer robot 257 configured to transfer the substrate W from the notch aligner 248 to the notch polishing module 255, a top-edge polishing module (a second polishing module) 256 configured to polish the top edge portion of the substrate W, a cleaning module 260 configured to clean the polished substrate W, a drying module 265 configured to dry the cleaned substrate W, and a transfer mechanism 270 configured to transfer the substrate W from the notch polishing module 255 to the top-edge polishing module 256, the cleaning module 260, and the drying module 265 successively in this order.

A known notch polishing apparatus, such as one disclosed in Japanese laid-open patent publication No. 2009-154285, can be used as the notch polishing module 255. The above-described polishing apparatus shown in FIG. 5 or FIG. 26 can be used as the top-edge polishing module 256. The cleaning module 260 may be a roll-sponge type cleaning device that is configured to bring rotating roll sponges into contact with the upper surface and the lower surface of the rotating substrate W while supplying liquid on the substrate W. The drying module 265 may be a spin drying device configured to rotate the substrate W at high speed.

The notch polishing module 255, the top-edge polishing module 256, the cleaning module 260, and the drying module 265 (hereinafter, these modules will be collectively referred to as substrate processing modules) are arranged in a line. The transfer mechanism 270 is arranged along an arrangement direction of these substrate processing modules. The transfer mechanism 270 has hand units 270A, 270B, and 270C. Each hand unit has a pair of hands 271 for holding the substrate W and is configured to transfer the substrate W between the neighboring substrate processing modules. More specifically, the hand unit 270A is operable to remove the substrate W from the notch polishing module 255 and transfer it to the top-edge polishing module 256, the hand unit 270B is operable to remove the substrate W from the top-edge polishing module 256 and transfer it to the cleaning module 260, and the hand unit 270C is operable to remove the substrate W from the cleaning module 260 and transfer it to the drying module 265.

These hand units 270A, 270B, and 270C are movable linearly along the arrangement direction of the substrate processing modules. The hand units 270A, 270B, and 270C are configured to remove the substrates W from the substrate processing modules simultaneously, move simultaneously, and transfer the substrates W into the neighboring substrate processing modules simultaneously.

Next, overall processing flow of the substrate W will be described. The first transfer robot 245 removes the substrate W from the wafer cassette, and places the substrate W onto the notch aligner 248. The notch aligner 248 is moved together with the substrate W by the notch-aligner moving mechanism 250 to a position near the second transfer robot 257. During this movement, the notch aligner 248 detects the position of the notch portion of the substrate W and rotates the substrate W such that the notch portion is in a predetermined position.

Then, the second transfer robot 257 receives the substrate W from the notch aligner 248, and transfers the substrate W into the notch polishing module 255. The notch portion of the substrate W is polished by the notch polishing module 255. The polished substrate W is transferred to the top-edge polishing module 256, the cleaning module 260, and the drying module 265 successively in this order by the hand units 270A, 270B, and 270C as described above, so that the substrate W is processed in these substrate processing modules. The processed substrate W is transferred by the first transfer robot 245 into the wafer cassette on the loading port 240.

The notch polishing module 255 and the top-edge polishing module 256 are removably installed in the substrate processing apparatus. Therefore, it is possible to remove the notch polishing module 255 and/or the top-edge polishing module 256 and to install different type of polishing module in the substrate processing apparatus. For example, the polishing apparatus according to above-described embodiment that can polish the top edge portion of the substrate W may be used as the first polishing module, and a known bevel polishing module that can polish the bevel portion of the substrate W may be used as the second polishing module.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. An apparatus for a polishing a peripheral portion of a substrate, said apparatus comprising:
    a substrate holder configured to hold the substrate and to rotate the substrate; and
    a polishing unit configured to polish the peripheral portion of the substrate, said polishing unit including:
        a polishing head having a pressing member configured to press a longitudinal edge of a polishing tape against the peripheral portion of the substrate; and
        a tape supply and recovery mechanism configured to supply the polishing tape to said polishing head and to recover the polishing tape from said polishing head;
    wherein said tape supply and recovery mechanism has guide rollers for supporting the polishing tape, said guide rollers being arranged such that the longitudinal edge of the polishing tape is to contact a circular boundary between a region of the substrate to be polished and a region of the substrate not to be polished, and such that the longitudinal edge of the polishing tape is substantially perpendicular to a radial direction of the substrate at a pressing location where the pressing member presses the longitudinal edge of the polishing tape against the peripheral portion of the substrate.

2. The apparatus according to claim 1, further comprising:
    a polishing-unit moving mechanism configured to move an entirety of said polishing unit in the tangential direction of the substrate.

3. The apparatus according to claim 1, wherein said pressing member has a through-hole extending in a vertical direction, and said through-hole is coupled to a vacuum line.

4. The apparatus according to claim 1, further comprising a plurality of polishing units, said polishing unit comprising a first polishing unit of said plurality of polishing units.

5. The apparatus according to claim 1, wherein said polishing head has a position sensor configured to detect a vertical position of said pressing member.

6. The apparatus according to claim 1, wherein said guide rollers are further arranged such that a polishing surface of the polishing tape is parallel to a plane of an uppermost surface of the substrate.

7. The apparatus according to claim 1, further comprising:
a first moving mechanism configured to move said polishing head in a radial direction of the substrate; and
a second moving mechanism configured to operate independently of said first moving mechanism and configured to move said tape supply and recovery mechanism relative to said polishing head and in the radial direction of the substrate.

8. The apparatus according to claim 1, wherein said guide rollers are further arranged such that the longitudinal edge of the polishing tape extends parallel to a plane of an uppermost surface of the substrate.

9. A method of polishing a peripheral portion of a substrate, said method comprising:
rotating the substrate;
providing a polishing tape above the peripheral portion of the substrate such that a longitudinal edge of the polishing tape is to contact a circular boundary between a region of the substrate to be polished and a region of the substrate not to be polished; and
pressing the longitudinal edge of the polishing tape against the peripheral portion of the substrate by a pressing member to polish the peripheral portions;
wherein the longitudinal edge of the polishing tape is substantially perpendicular to a radial direction of the substrate at a pressing location where the pressing member presses the longitudinal edge of the polishing tape against the peripheral portion of the substrate.

10. The method according to claim 9, wherein said pressing of the longitudinal edge of the polishing tape against the peripheral portion of the substrate is performed while oscillating the polishing tape in a tangential direction of the substrate.

11. The method according to claim 9, wherein said pressing of the longitudinal edge of the polishing tape against the peripheral portion of the substrate is performed with an edge of the pressing member coinciding with the longitudinal edge of the polishing tape.

12. The method according to claim 9, wherein said pressing of the longitudinal edge of the polishing tape against the peripheral portion of the substrate is performed with the polishing tape secured to the pressing member by vacuum suction.

13. The method according to claim 9, further comprising:
terminating said polishing of the peripheral portion of the substrate based on a vertical position of the pressing member.

14. The method according to claim 9, wherein the polishing tape is provided above the peripheral portion of the substrate such that a first polishing surface of the polishing tape is parallel to a plane of an uppermost surface of the substrate, and such that a second polishing surface of the longitudinal edge of the polishing tape is perpendicular to the plane of the uppermost surface of the substrate.

15. The method according to claim 9, wherein the polishing tape is provided above the peripheral portion of the substrate such that the longitudinal edge of the polishing tape extends parallel to a plane of an uppermost surface of the substrate.

16. An apparatus for a polishing a peripheral portion of a substrate, said apparatus comprising:
a substrate holder configured to hold the substrate and to rotate the substrate; and
a polishing unit configured to polish the peripheral portion of the substrate, said polishing unit including:
a polishing head having a pressing member configured to press a longitudinal edge of a polishing tape against the peripheral portion of the substrate;
a tape supply and recovery mechanism configured to supply the polishing tape to said polishing head and to recover the polishing tape from said polishing head;
a first moving mechanism configured to move said polishing head parallel to a plane of an uppermost surface of the substrate and in a radial direction of the substrate; and
a second moving mechanism configured to operate independently of said first moving mechanism and configured to move said tape supply and recovery mechanism relative to said polishing head and parallel to the plane of the uppermost surface of the substrate in the radial direction of the substrate,
wherein said tape supply and recovery mechanism has guide rollers for supporting the polishing tape, said guide rollers being arranged such that the longitudinal edge of the polishing tape is to contact a circular boundary between a region of the substrate to be polished and a region of the substrate not to be polished, and such that the longitudinal edge of the polishing tape is substantially perpendicular to a radial direction of the substrate at a pressing location where the pressing member presses the longitudinal edge of the polishing tape against the peripheral portion of the substrate.

17. The apparatus according to claim 16, further comprising:
a tape-edge detection sensor configured to detect a position of the longitudinal edge of the polishing tape.

18. The apparatus according to claim 17, wherein:
said first moving mechanism is configured to move said pressing member to a predetermined polishing position; and
said second moving mechanism is configured to move said tape supply and recovery mechanism such that the longitudinal edge of the polishing tape coincides with an edge of said pressing member at the predetermined polishing position based on the position of the longitudinal edge of the polishing tape detected by said tape-edge detection sensor.

* * * * *